(12) United States Patent
Chiang et al.

(10) Patent No.: US 11,349,069 B2
(45) Date of Patent: May 31, 2022

(54) RESISTIVE MEMORY DEVICES USING A CARBON-BASED CONDUCTOR LINE AND METHODS FOR FORMING THE SAME

(71) Applicant: Taiwan Semiconductor Manufacturing Company Limited, Hsinchu (TW)

(72) Inventors: Hung-Li Chiang, Taipei (TW); Chao-Ching Cheng, Hsinchu (TW); Tzu-Chiang Chen, Hsinchu (TW); Lain-Jong Li, Hsinchu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 64 days.

(21) Appl. No.: 16/715,216

(22) Filed: Dec. 16, 2019

(65) Prior Publication Data
US 2021/0184111 A1   Jun. 17, 2021

(51) Int. Cl.
*H01L 45/00* (2006.01)
*H01L 27/24* (2006.01)

(52) U.S. Cl.
CPC .......... *H01L 45/06* (2013.01); *H01L 27/2427* (2013.01); *H01L 27/2481* (2013.01); *H01L 45/149* (2013.01); *H01L 45/1608* (2013.01)

(58) Field of Classification Search
CPC ... H01L 45/06; H01L 45/149; H01L 27/2481; H01L 27/2427; H01L 45/1608
See application file for complete search history.

(56) References Cited

U.S. PATENT DOCUMENTS

| | | | |
|---|---|---|---|
| 2016/0260732 A1* | 9/2016 | Lue | H01L 27/11565 |
| 2016/0365351 A1* | 12/2016 | Nishikawa | H01L 27/1157 |
| 2017/0025477 A1* | 1/2017 | Boniardi | H01L 45/1233 |
| 2019/0198096 A1* | 6/2019 | Mirichigni | G11C 8/14 |
| 2020/0203362 A1* | 6/2020 | Rabkin | H01L 27/1157 |
| 2020/0395408 A1* | 12/2020 | Takahashi | H01L 27/2409 |

* cited by examiner

*Primary Examiner* — Jerome Leboeuf
(74) *Attorney, Agent, or Firm* — The Marbury Law Group, PLLC

(57) ABSTRACT

An array of rail structures is formed over a substrate. Each rail structure includes at least one bit line. Dielectric isolation structures straddling the array of rail structures are formed. Line trenches are provided between neighboring pairs of the dielectric isolation structures. A layer stack of a resistive memory material layer and a selector material layer is formed within each of the line trenches. A word line is formed on each of the layer stacks within unfilled volumes of the line trenches. The word lines or at least a subset of the bit lines includes a carbon-based conductive material containing hybridized carbon atoms in a hexagonal arrangement to provide a low resistivity conductive structure. An array of resistive memory elements is formed over the substrate. A plurality of arrays of resistive memory elements may be formed at different levels over the substrate.

20 Claims, 31 Drawing Sheets

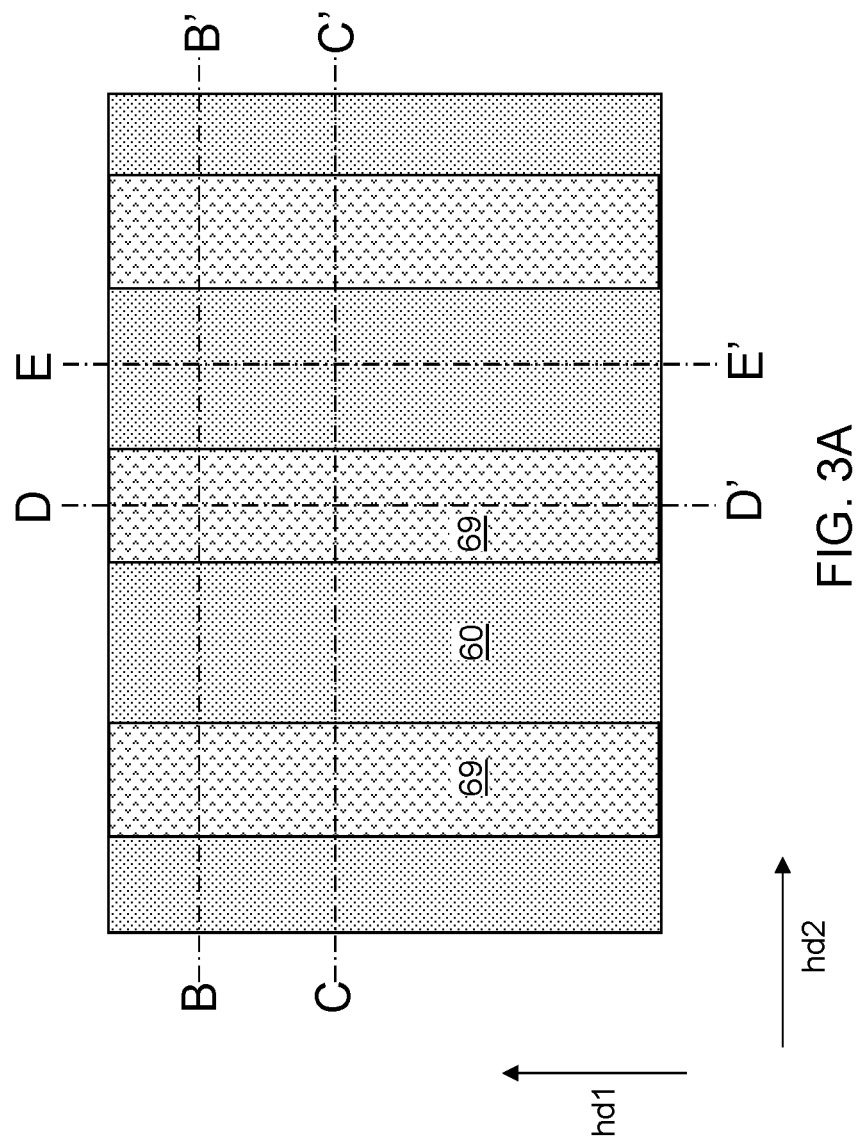

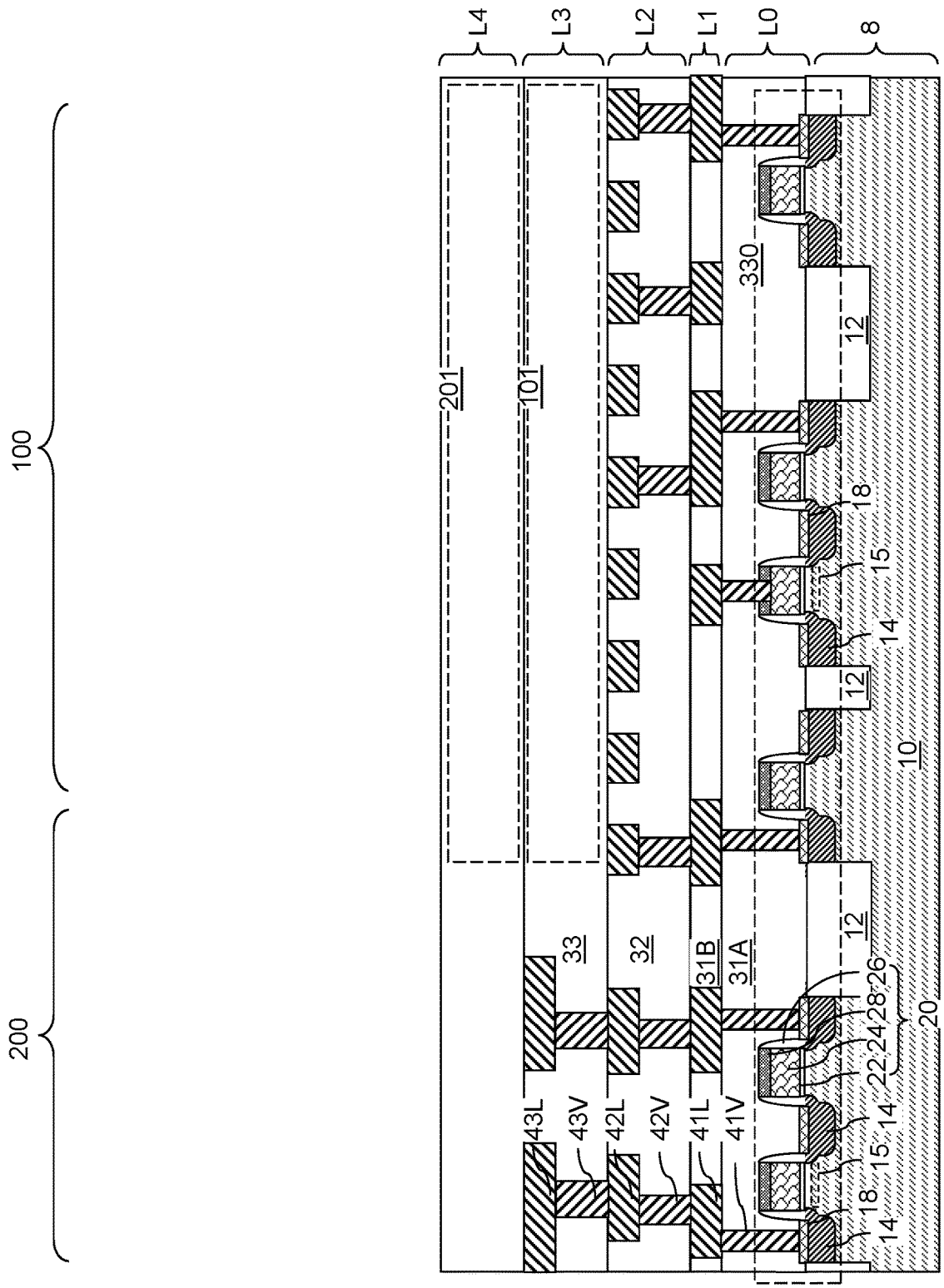

RESISTIVE MEMORY DEVICES USING A CARBON-BASED CONDUCTOR LINE AND METHODS FOR FORMING THE SAME

BACKGROUND

The present disclosure is directed to semiconductor devices, and specifically to resistive memory devices using at least one carbon-based conductor line and methods of forming the same.

Resistive memory devices use a memory element that can provide at least two resistive state, each providing different levels of electrical resistance. RC delay for resistive memory devices in an array environment increases with scaling of resistive memory devices because reduction of dimensions of metal lines causes increase in the resistance of the metal lines. Prior art metal lines use a combination of a metallic nitride liner and a metallic fill material having lower electrical resistivity than the metallic nitride liner. However, the thickness of the metallic nitride liner cannot be reduced below a minimum thickness during scaling of dimensions because the metallic nitride liner needs to fully function as an adhesion promotion layer for the metallic fill material and as a diffusion barrier layer. Thus, prior art metal lines using a combination of a metallic nitride liner and a metallic fill material provide high resistivity with scaling of dimensions.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 3A is a top-down view of the portion of the memory array region after formation of an array of rail structures according to an embodiment of the present disclosure.

FIG. 14D is a vertical cross-sectional view of the second exemplary structure during after formation of a second array of resistive memory elements according to an embodiment of the present disclosure.

DETAILED DESCRIPTION

Figure 1A:
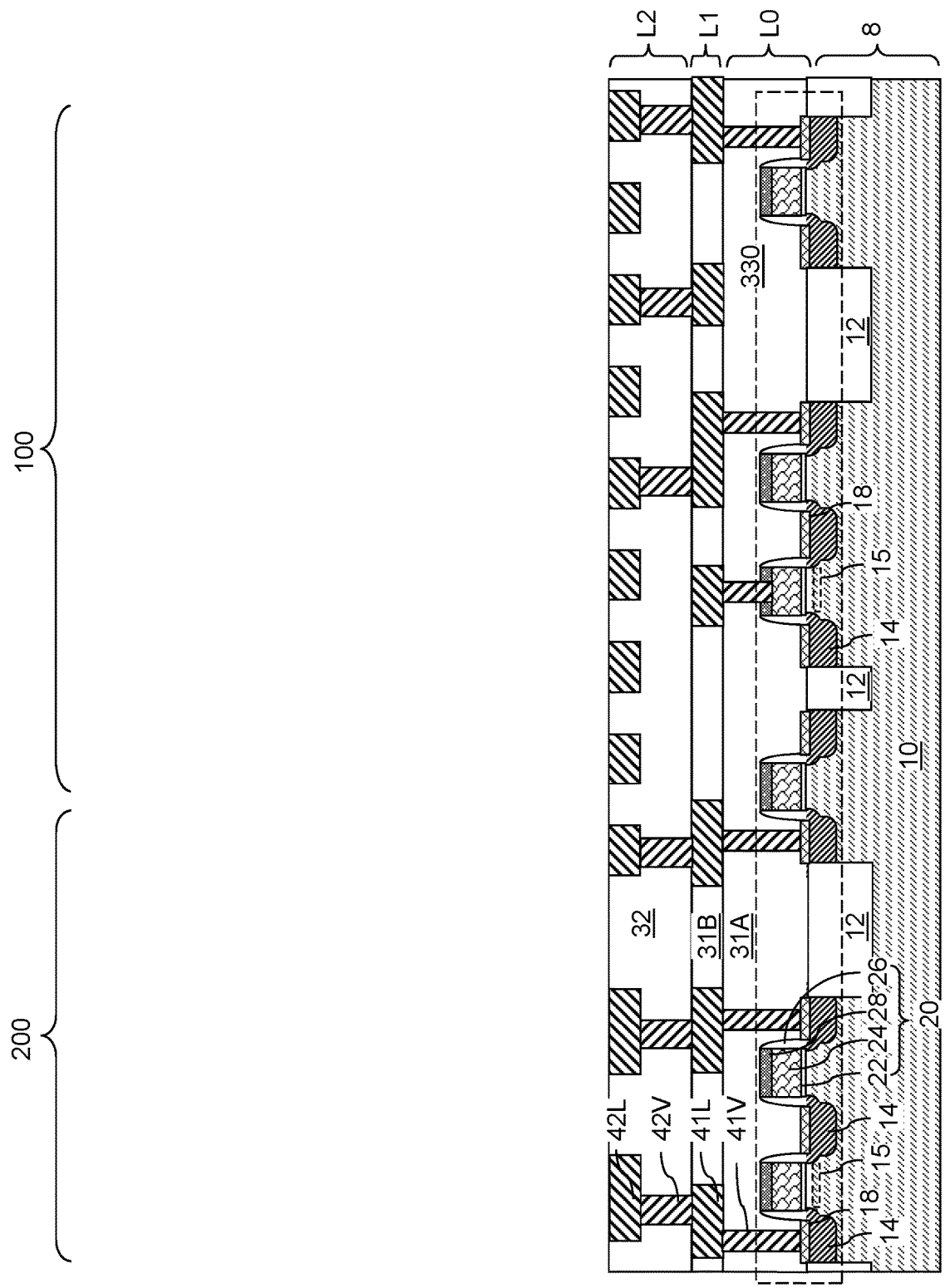
FIG. 1A is a vertical cross-sectional view of a first exemplary structure during prior to formation of an array of resistive memory elements according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Generally, the structures and methods of the present disclosure can be used to form at least one layer of a two-dimensional array of resistive memory elements in a metal interconnect level. The resistive memory elements may be formed in a cross-point array configuration at each intersection point between rows of word lines and columns of bit lines. Each bit line can be provided within a respective rail structure. In some embodiments, each rail structure can include a vertical stack including a lower bit line and an upper bit line, and a first layer of a lower two-dimensional array of resistive memory elements and a second layer of an upper two-dimensional array of resistive memory elements that share a same set of word lines can be provided. The rail structures including the bit lines can be arranged as columns that laterally extend along a first horizontal direction. Dielectric isolation structures that laterally extend along a second horizontal direction can be formed over the columns of rail structures. A layer stack including a resistive memory material layer and a selector material layer can be formed in each line trench located between each neighboring pair of dielectric isolation structures. Word lines can be formed in unfilled portions of the line trenches on a respective layer stack of a resistive memory material layer and a selective material layer. Each portion of a resistive memory material layer located between a neighboring pair of a bit line and a word line constitutes a memory element. Multiple two-dimensional arrays of resistive memory elements can be stacked over multiple metal interconnect levels to provide a three-dimensional array of resistive memory elements. Various features of the structures and methods of the present disclosure are described in detail herebelow.

Referring to FIG. 1A, a first exemplary structure according to an embodiment of the present disclosure is illustrated prior to formation of an array of resistive memory elements. The first exemplary structure includes a substrate 8 that contains a semiconductor material layer 10. The substrate 8 can include a bulk semiconductor substrate such as a silicon substrate in which the semiconductor material layer continuously extends from a top surface of the substrate 8 to a bottom surface of the substrate 8, or a semiconductor-on-insulator layer including the semiconductor material layer 10 as a top semiconductor layer overlying a buried insulator layer (such as a silicon oxide layer). The exemplary structure can include various devices regions, which can include a memory array region 100 in which at least one array of resistive memory elements may be subsequently formed and a peripheral region 200 in which electrical connections between each array of resistive memory elements and a peripheral circuit including field effect transistors may be subsequently formed. Areas of the memory array region 100 and the peripheral region 200 can be used to form various elements of the peripheral circuit.

Semiconductor devices such as field effect transistors can be formed on, and/or in, the semiconductor material layer 10. For example, shallow trench isolation structures 12 can be formed in an upper portion of the semiconductor material layer 10 by forming shallow trenches and subsequently filling the shallow trenches with a dielectric material such as silicon oxide. Various doped wells (not expressly shown) can be formed in various regions of the upper portion of the semiconductor material layer 10 by performing masked ion implantation processes.

Gate structures 20 can be formed over the top surface of the substrate 8 by depositing and patterning a gate dielectric layer, a gate electrode layer, and a gate cap dielectric layer. Each gate structure 20 can include a vertical stack of a gate dielectric 22, a gate electrode 24, and a dielectric gate cap 28, which is herein referred to as a gate stack (22, 24, 28). Ion implantation processes can be performed to form extension implant regions, which can include source extension regions and drain extension regions. Dielectric gate spacers 26 can be formed around the gate stacks (22, 24, 28). Each assembly of a gate stack (22, 24, 28) and a dielectric gate spacer 26 constitutes a gate structure 20. Additional ion implantation processes can be performed using the gate structures 20 as self-aligned implantation masks to form deep active regions, which can include deep source regions and deep drain regions. Upper portions of the deep active regions can overlap with portions of the extension implantation regions. Each combination of an extension implantation region and a deep active region constitutes an active region 14, which may be a source region or a drain region depending on electrical biasing. A semiconductor channel 15 can be formed underneath each gate stack (22, 24, 28) between a neighboring pair of active regions 14. Metal-semiconductor alloy regions 18 can be formed on the top surface of each active region 14. Field effect transistors can be formed on the semiconductor material layer 10. Each field effect transistor can include a gate structure 20, a semiconductor channel 15, a pair of active regions 14 (one of which functions as a source region and another of which functions as a drain region), and optional metal-semiconductor alloy regions 19. A complementary metal-oxide-semiconductor (CMOS) circuit 330 can be provided on the semiconductor material layer 10, which can include a periphery circuit for the array(s) of resistive memory elements to be subsequently formed.

Various interconnect-level structures can be subsequently formed, which are formed prior to formation of an array of resistive memory elements and are herein referred to as lower interconnect-level structures (L0, L1, L2). In case a two-dimensional array of resistive memory elements is to be subsequently formed over two levels of interconnect-level metal lines, the lower interconnect-level structures (L0, L1, L2) can include a contact-level structure L0, a first interconnect-level structure L1, and a second interconnect-level structure L2. The contact-level structure L0 can include a planarization dielectric layer 31A including a planarizable dielectric material such as silicon oxide and various contact via structures 41V contacting a respective one of the active regions 14 or the gate electrodes 24 and formed within the planarization dielectric layer 31A. The first interconnect-level structure L1 includes a first interconnect-level dielectric layer 31B and first metal lines 41L formed within the first interconnect-level dielectric layer 31B. The first interconnect-level dielectric layer 31B is also referred to as a first line-level dielectric layer. The first metal lines 41L can contact a respective one of the contact via structures 41V. The second interconnect-level structure L2 includes a second interconnect-level dielectric layer 32, which may include a stack of a first via-level dielectric material layer and a second line-level dielectric material layer or a line-and-via-level dielectric material layer. The second interconnect-level dielectric layer 32 covers second interconnect-level metal interconnect structures (42V, 42L), which includes first metal via structures 42V and second metal lines 42L. Top surfaces of the second metal lines 42L can be coplanar with the top surface of the second interconnect-level dielectric layer 32.

Figure 1B:
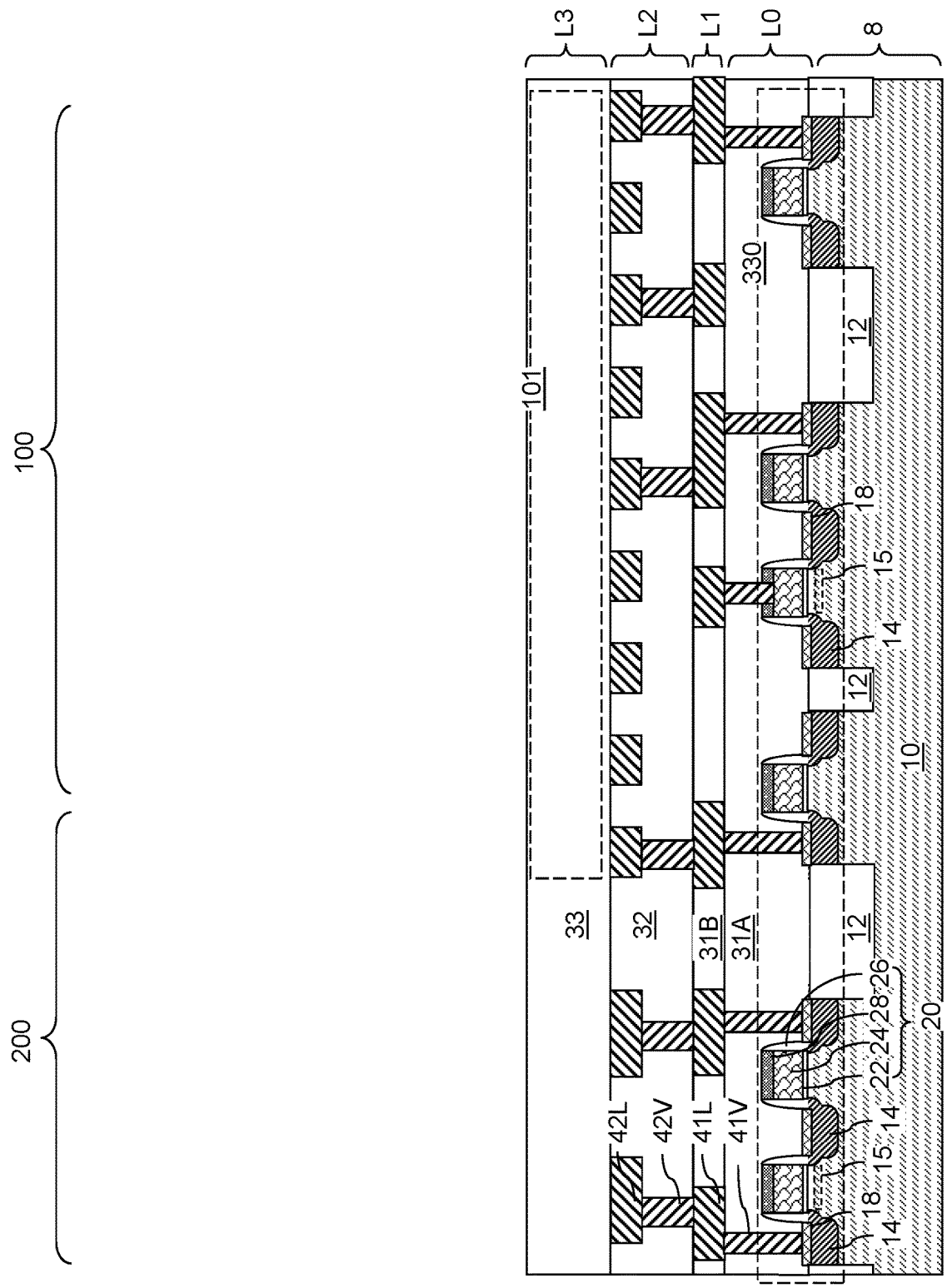
FIG. 1B is a vertical cross-sectional view of the first exemplary structure during after formation of the array of resistive memory elements according to an embodiment of the present disclosure.

Referring to FIG. 1B, an array 101 of resistive memory elements can be formed in the memory array region 100 over the second interconnect-level structure L2. The details for the structure and the processing steps for the array 101 of resistive memory elements are subsequently described in detail. A third interconnect-level dielectric layer 33 can be formed during formation of the array 101 of resistive memory elements. The set of all structures formed at the level of the array 101 of resistive memory elements is herein referred to as a third interconnect-level structure L3.

Figure 1C:
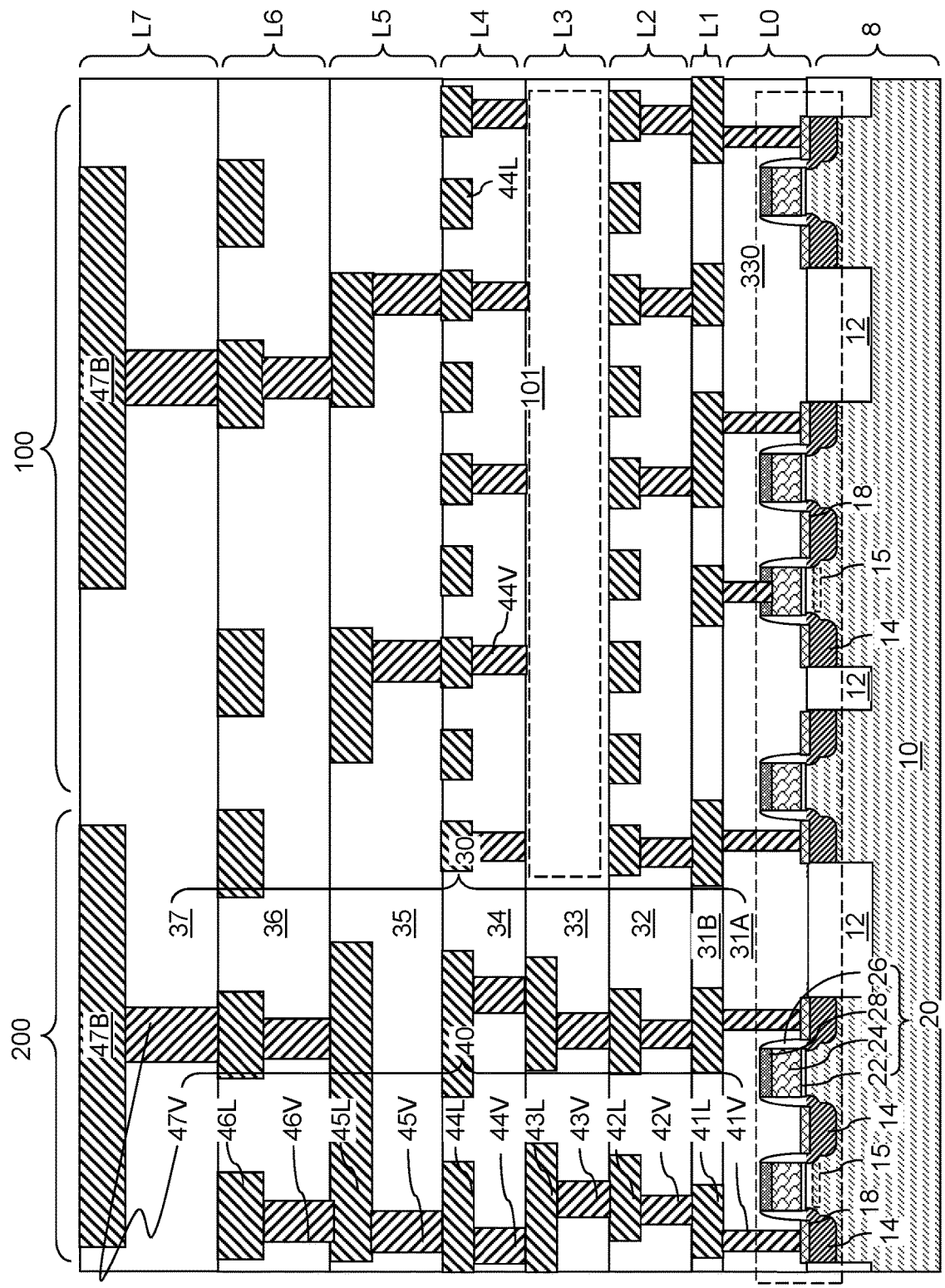
FIG. 1C is a vertical cross-sectional view of the first exemplary structure during after formation of upper-level metal interconnect structures according to an embodiment of the present disclosure.

Referring to FIG. 1C, third interconnect-level metal interconnect structures (43V, 43L) can be formed in the third interconnect-level dielectric layer 33. The third interconnect-level metal interconnect structures (43V, 43L) can include second metal via structures 43V and third metal lines 43L. Additional interconnect-level structures may be subsequently formed, which are herein referred to as upper interconnect-level structures (L4, L5, L6, L7). For example, the upper interconnect-level structures (L4, L5, L6, L7) can include a fourth interconnect-level structure L4, a fifth interconnect-level structure L5, a sixth interconnect-level structure L6, and a seventh interconnect-level structure L7. The fourth interconnect-level structure L4 can include a fourth interconnect-level dielectric layer 34 covering fourth interconnect-level metal interconnect structures (44V, 44L), which can include third metal via structures 44V and fourth metal lines 44L. The fifth interconnect-level structure L5 can include a fifth interconnect-level dielectric layer 35 forming fifth interconnect-level metal interconnect structures (45V, 45L), which can include fourth metal via structures 45V and fifth metal lines 45L. The sixth interconnect-level structure L6 can include a sixth interconnect-level dielectric layer 36 forming sixth interconnect-level metal interconnect structures (46V, 46L), which can include fifth metal via structures 46V and sixth metal lines 46L. The seventh interconnect-level structure L7 can include a seventh interconnect-level dielectric layer 37 forming sixth metal via structures 47V (which are seventh interconnect-level metal interconnect structures) and metal bonding pads 47B. The metal bonding pads 47B may be configured for solder bonding (which may use C4 ball bonding or wire bonding), or may be configured for metal-to-metal bonding (such as copper-to-copper bonding).

Each interconnect-level dielectric layer may be referred to as an interconnect-level dielectric (ILD) layer 30. Each interconnect-level metal interconnect structures may be referred to as a metal interconnect structure 40. Each combination of a metal via structure and an overlying metal line located within a same interconnect-level structure (L2-L7) may be formed sequentially as two distinct structures by using two single damascene processes, or may be simultaneously formed as a unitary structure using a dual damascene process. Each of the metal interconnect structure 40 can include a respective metallic liner (such as a layer of TiN, TaN, or WN having a thickness in a range from 2 nm to 20 nm) and a respective metallic fill material (such as W, Cu, Co, Mo, Ru, other elemental metals, or an alloy or a combination thereof). Various etch stop dielectric layers and dielectric capping layers may be inserted between vertically neighboring pairs of ILD layers 30, or may be incorporated into one or more of the ILD layers 30.

While the present disclosure is described using an embodiment in which the array 101 of resistive memory elements is formed as a component of a third interconnect-level structure L3, embodiments are expressly contemplated herein in which the array 101 of resistive memory elements is formed as components of any other interconnect-level structure. Further, while the present disclosure is described using an embodiment in which a set of eight interconnect-level structures are formed, embodiments are expressly contemplated herein in which a different number of interconnect-level structures is used. In addition, embodiments are expressly contemplated herein in which two or more arrays 101 of resistive memory elements are provided within multiple interconnect-level structures in the memory array region 101. While the present disclosure is described using an embodiment in which an array 101 of resistive memory elements is formed in a single interconnect-level structure, embodiments are expressly contemplated herein in which an array 101 of resistive memory elements is formed over two vertically adjoining interconnect-level structures.

Figure 2A:
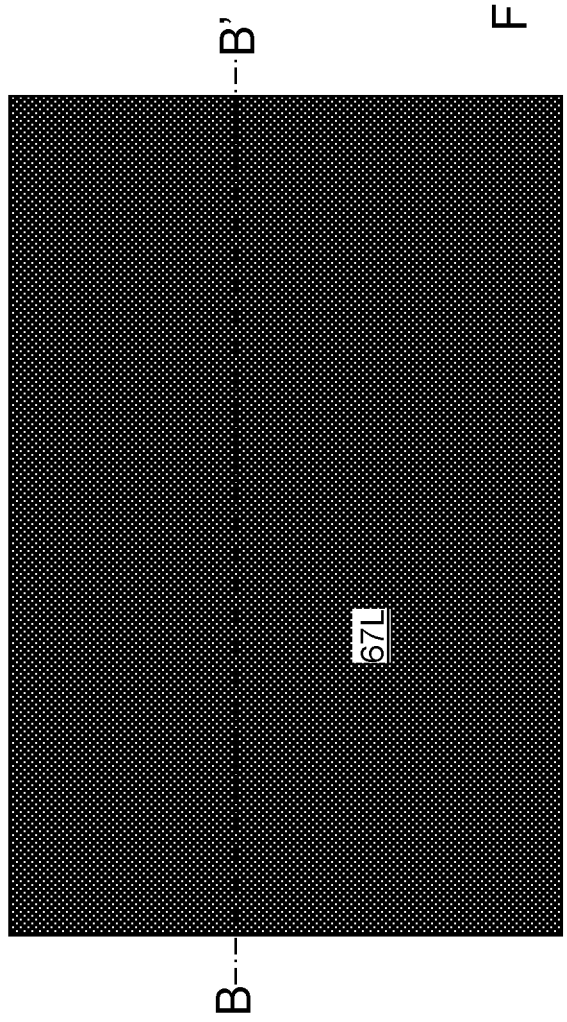
FIG. 2A is a top-down view of a portion of a memory array region after formation of a layer stack including a middle etch stop layer, a lower bit line material layer, an inter-bit-line dielectric layer, an upper bit line material layer, and a dielectric cap material layer according to an embodiment of the present disclosure.
Figure 2B:
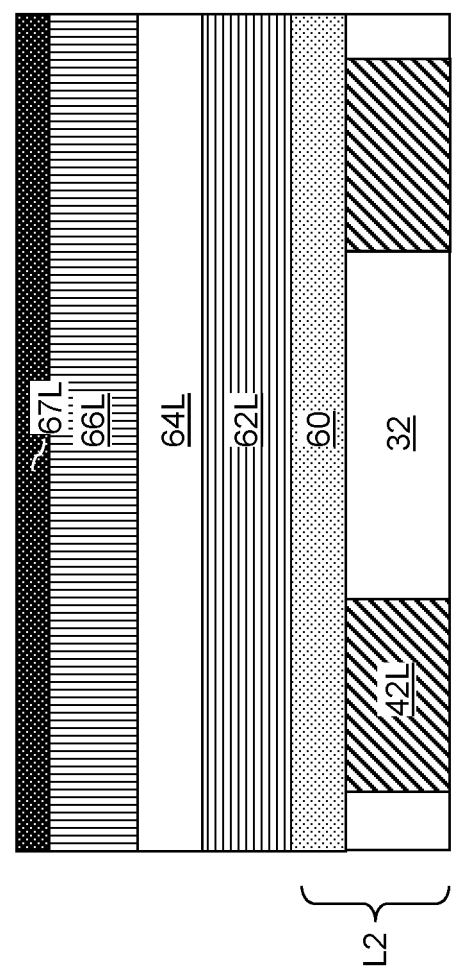
FIG. 2B is a vertical cross-sectional view of the portion of the memory array region along the vertical plane B-B' of FIG. 2A.
Figure 3D:
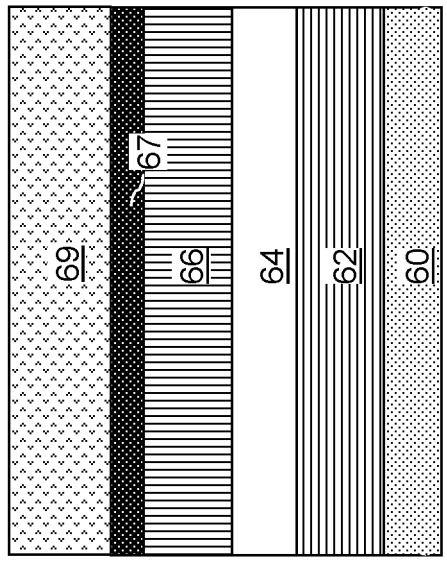
FIG. 3D is a vertical cross-sectional view of the portion of the memory array region along the vertical plane D-D' of FIG. 3A.
Figure 3E:
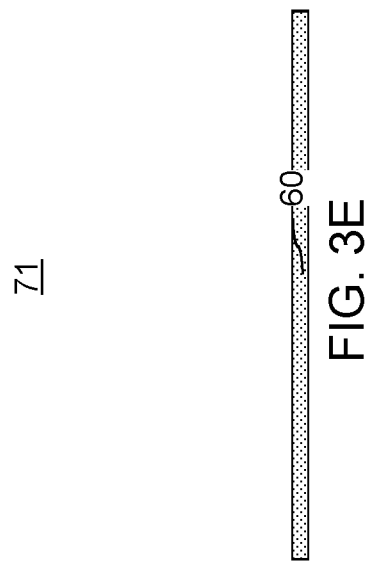
FIG. 3E is a vertical cross-sectional view of the portion of the memory array region along the vertical plane E-E' of FIG. 3A.
Figure 3B:
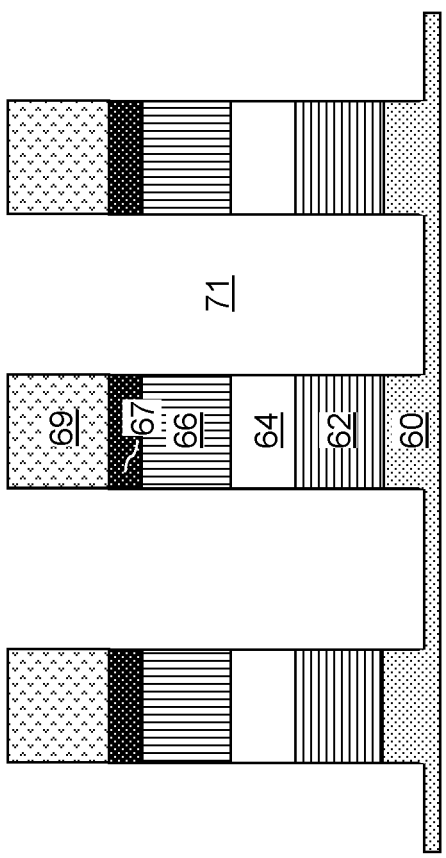
FIG. 3B is a vertical cross-sectional view of the portion of the memory array region along the vertical plane B-B' of FIG. 3A.
Figure 3C:
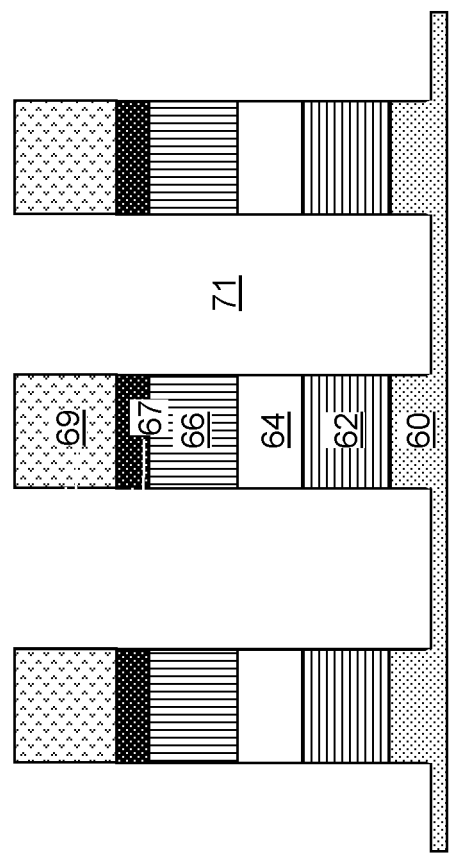
FIG. 3C is a vertical cross-sectional view of the portion of the memory array region along the vertical plane C-C' of FIG. 3A.
Figure 4A:
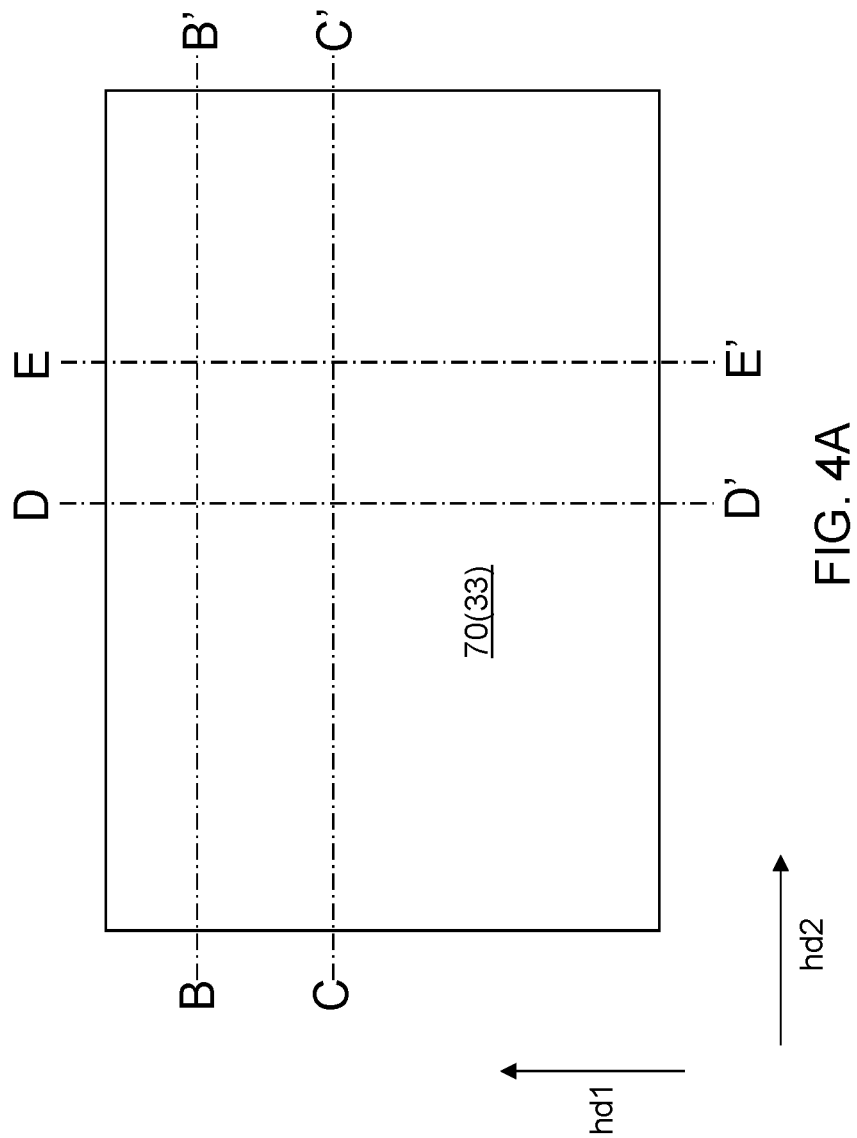
FIG. 4A is a top-down view of the portion of the memory array region after formation of a dielectric isolation material layer according to an embodiment of the present disclosure.
Figure 4D:
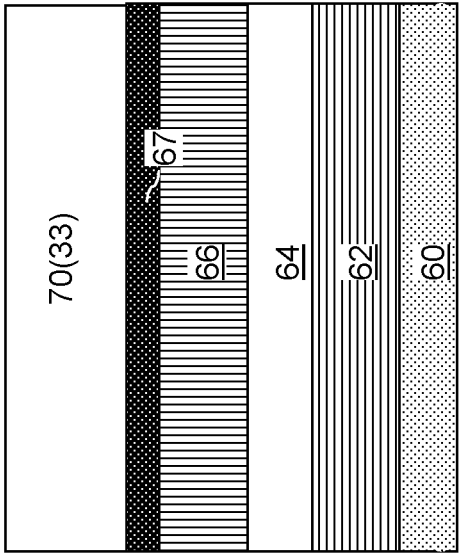
FIG. 4D is a vertical cross-sectional view of the portion of the memory array region along the vertical plane D-D' of FIG. 4A.
Figure 4E:
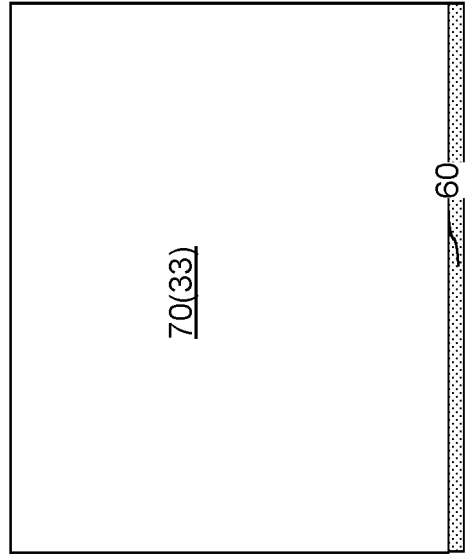
FIG. 4E is a vertical cross-sectional view of the portion of the memory array region along the vertical plane E-E' of FIG. 4A.
Figure 4B:
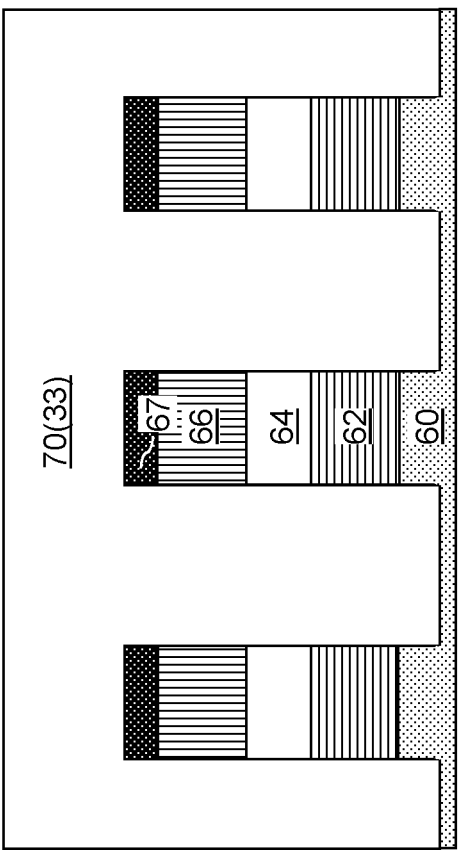
FIG. 4B is a vertical cross-sectional view of the portion of the memory array region along the vertical plane B-B' of FIG. 4A.
Figure 4C:
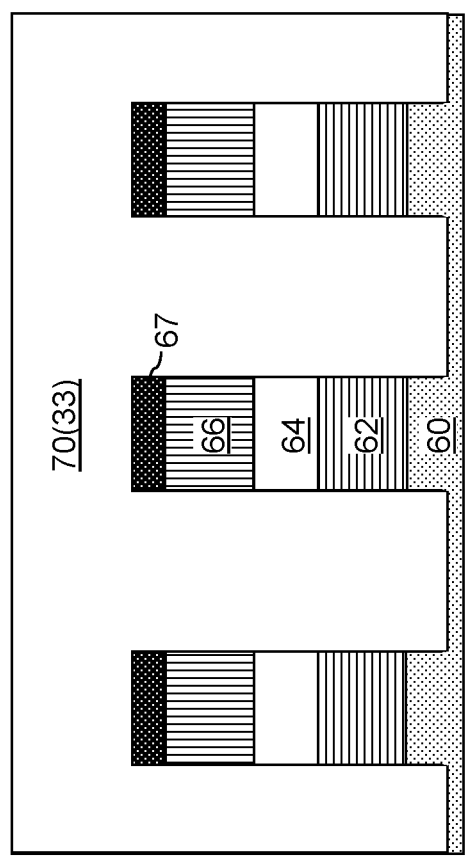
FIG. 4C is a vertical cross-sectional view of the portion of the memory array region along the vertical plane C-C' of FIG. 4A.
Figure 5A:
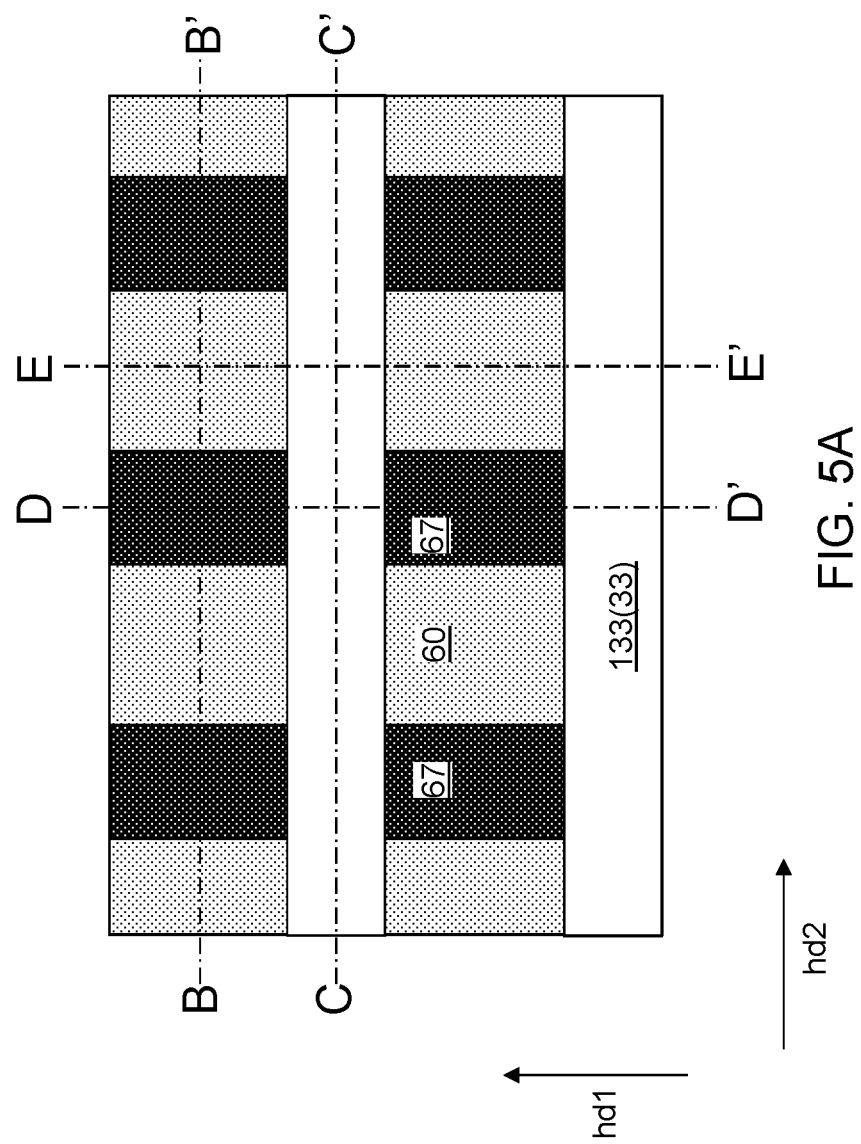
FIG. 5A is a top-down view of the portion of the memory array region after formation of dielectric isolation structures and line trenches according to an embodiment of the present disclosure.
Figure 5D:
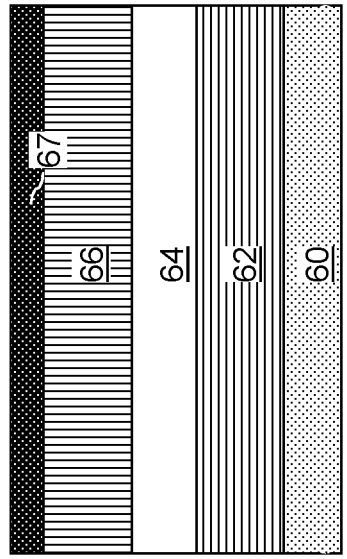
FIG. 5D is a vertical cross-sectional view of the portion of the memory array region along the vertical plane D-D' of FIG. 5A.
Figure 5E:
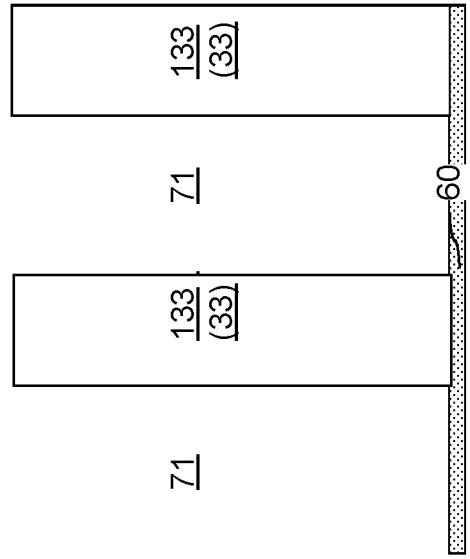
FIG. 5E is a vertical cross-sectional view of the portion of the memory array region along the vertical plane E-E' of FIG. 5A.
Figure 5B:
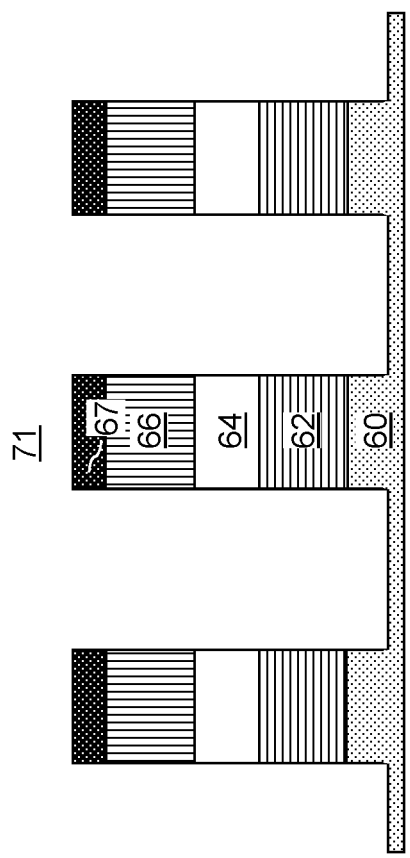
FIG. 5B is a vertical cross-sectional view of the portion of the memory array region along the vertical plane B-B' of FIG. 5A.
Figure 5C:
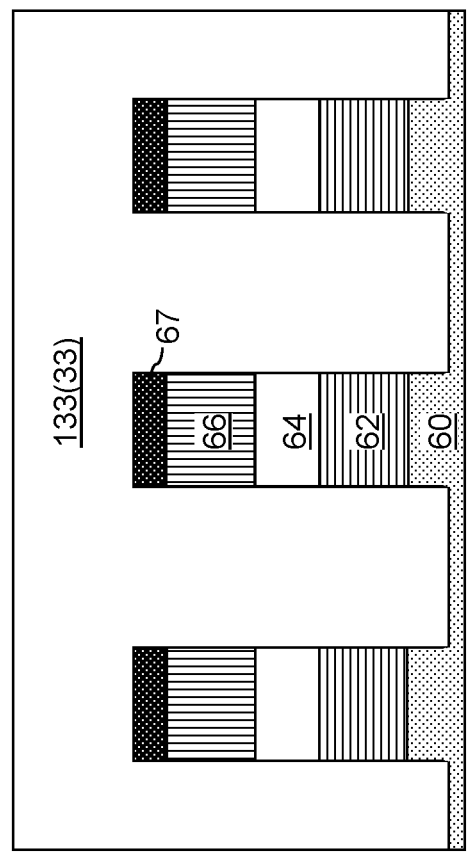
FIG. 5C is a vertical cross-sectional view of the portion of the memory array region along the vertical plane C-C' of FIG. 5A.
Figure 6A:
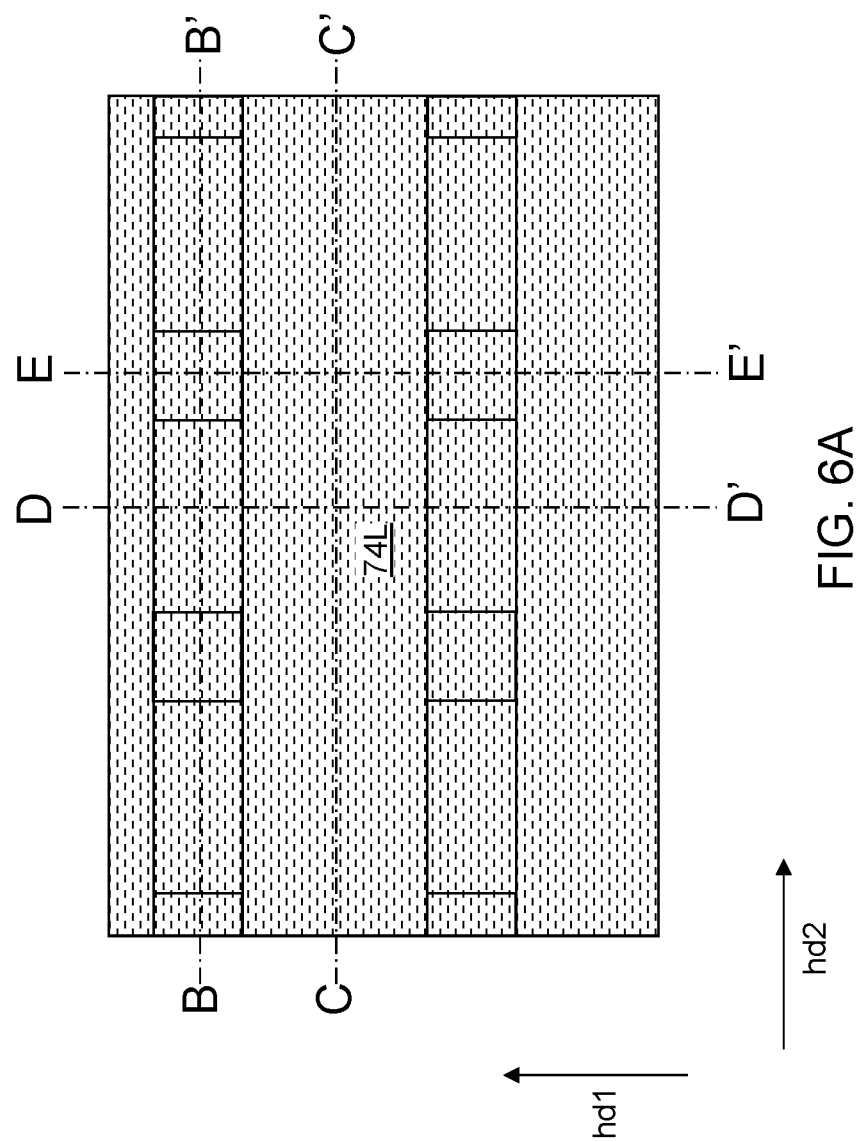
FIG. 6A is a top-down view of the portion of the memory array region after formation of a continuous resistive memory material layer and a continuous selector material layer in the line trenches and over the dielectric isolation structures according to an embodiment of the present disclosure.
Figure 6D:
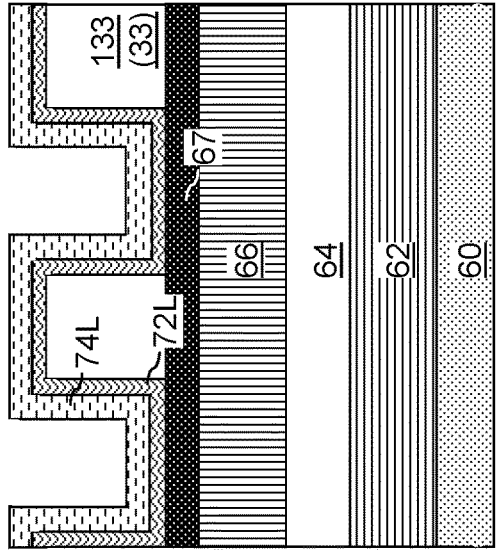
FIG. 6D is a vertical cross-sectional view of the portion of the memory array region along the vertical plane D-D' of FIG. 6A.
Figure 6E:
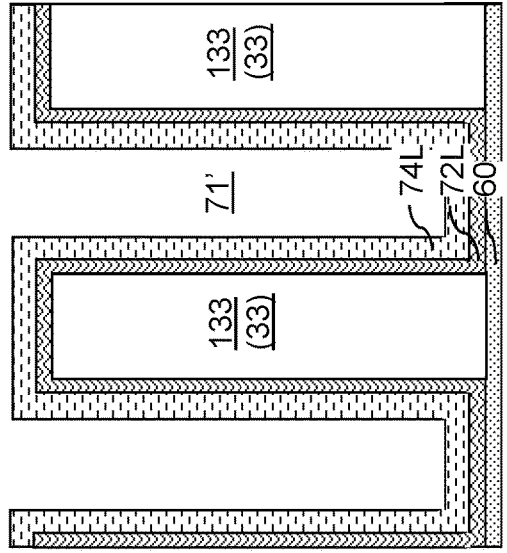
FIG. 6E is a vertical cross-sectional view of the portion of the memory array region along the vertical plane E-E' of FIG. 6A.
Figure 6B:
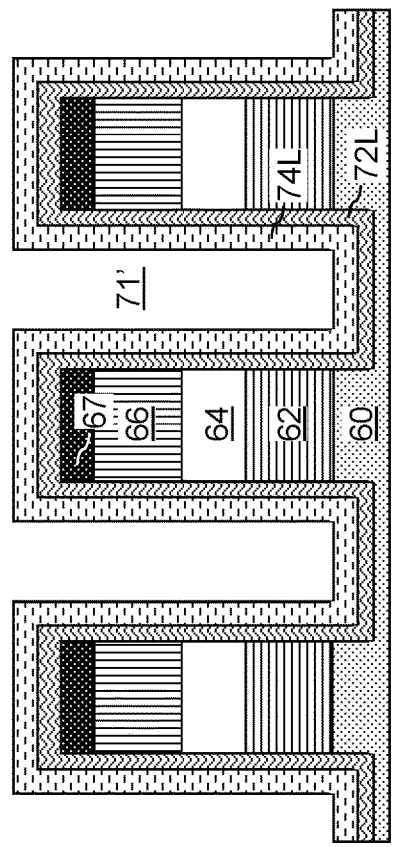
FIG. 6B is a vertical cross-sectional view of the portion of the memory array region along the vertical plane B-B' of FIG. 6A.
Figure 6C:
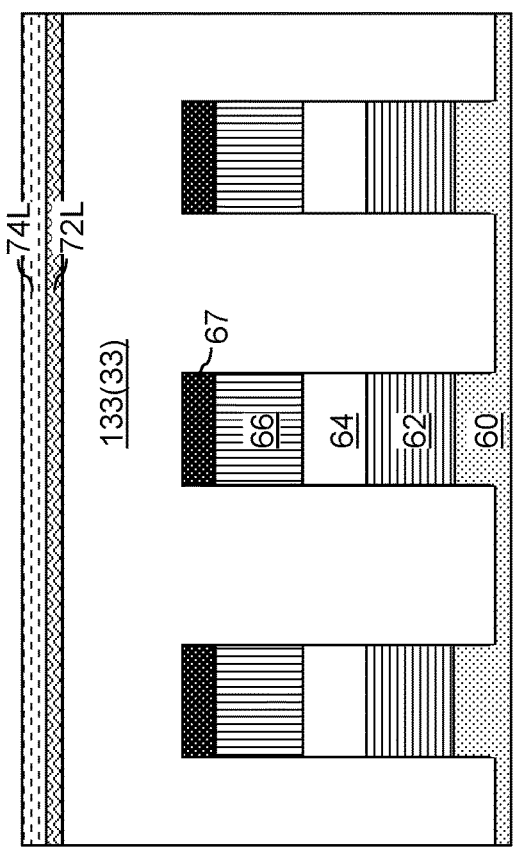
FIG. 6C is a vertical cross-sectional view of the portion of the memory array region along the vertical plane C-C' of FIG. 6A.
Figure 7A:
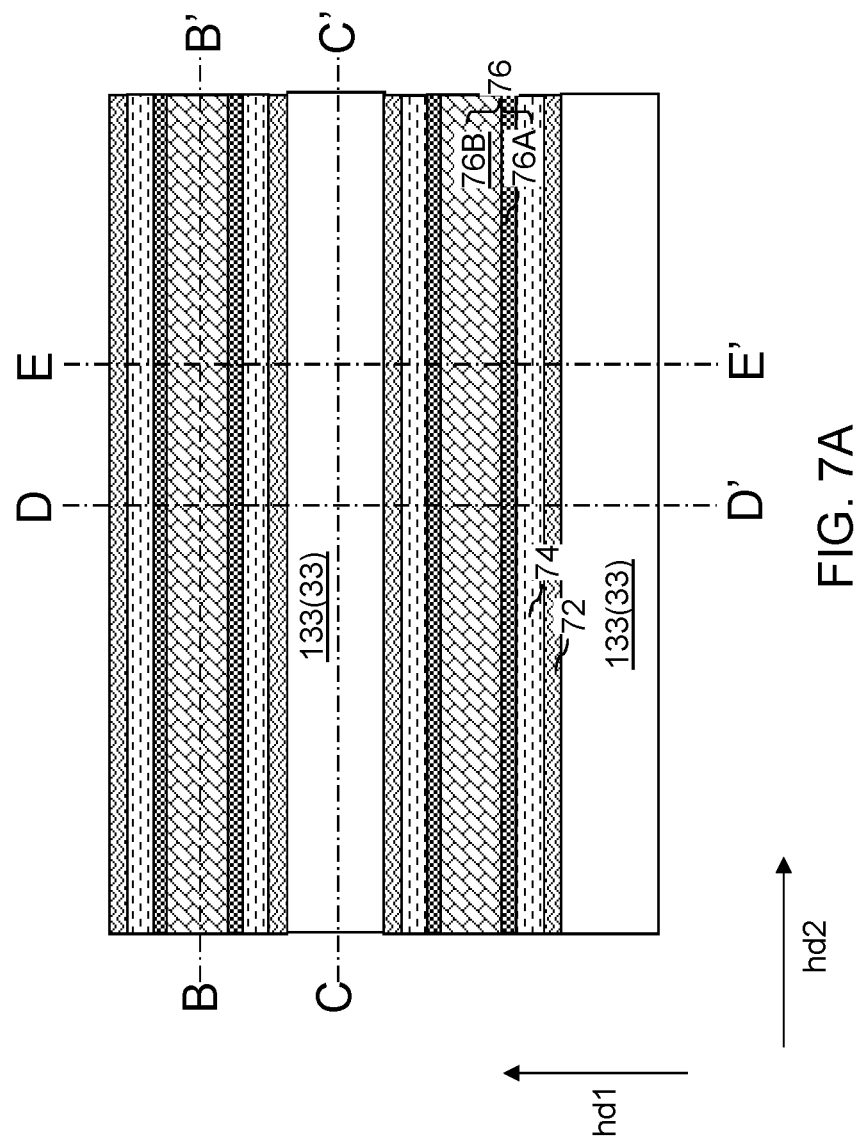
FIG. 7A is a top-down view of the portion of the memory array region after formation of word lines according to an embodiment of the present disclosure.
Figure 7D:
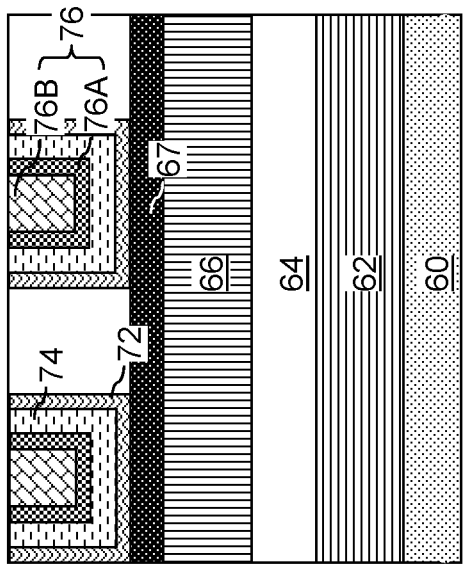
FIG. 7D is a vertical cross-sectional view of the portion of the memory array region along the vertical plane D-D' of FIG. 7A.
Figure 7E:
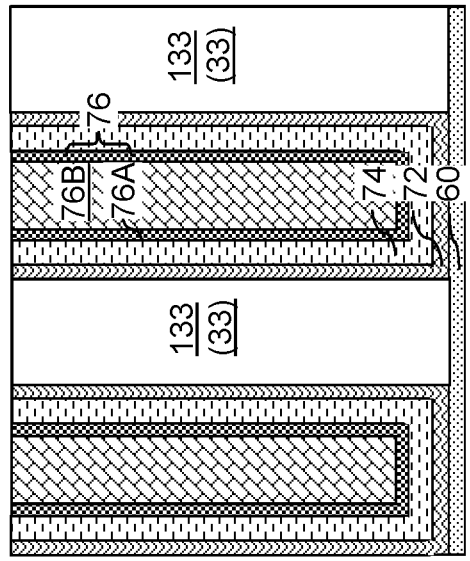
FIG. 7E is a vertical cross-sectional view of the portion of the memory array region along the vertical plane E-E' of FIG. 7A.
Figure 7B:
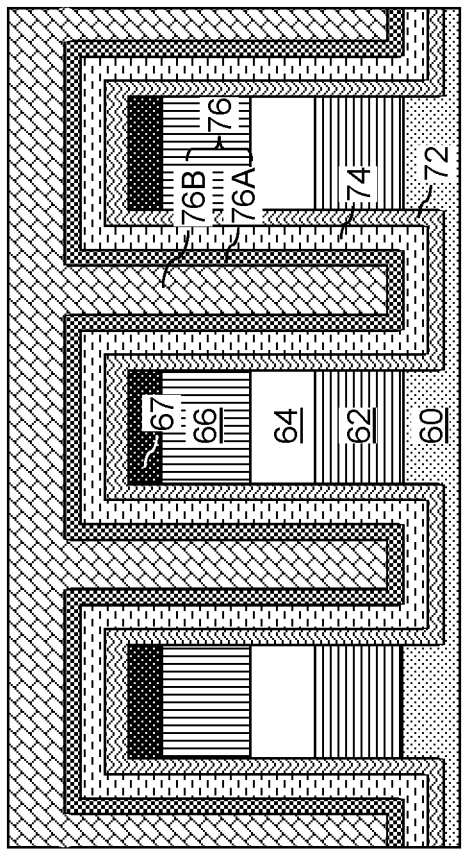
FIG. 7B is a vertical cross-sectional view of the portion of the memory array region along the vertical plane B-B' of FIG. 7A.
Figure 7C:
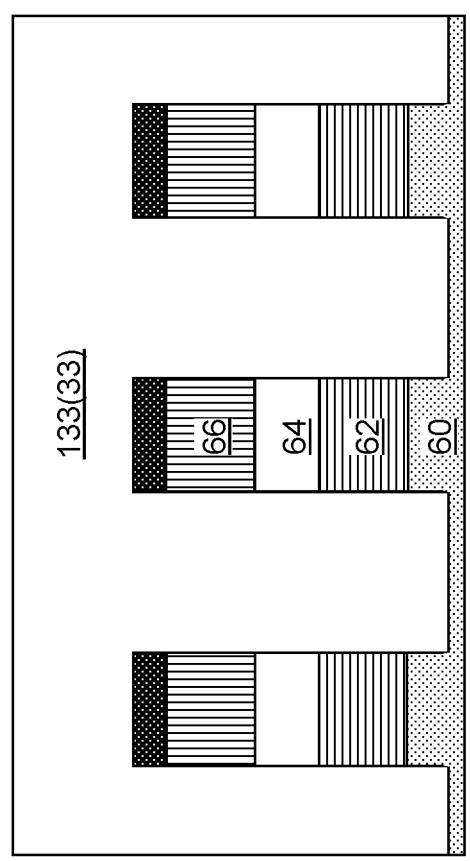
FIG. 7C is a vertical cross-sectional view of the portion of the memory array region along the vertical plane C-C' of FIG. 7A.
Figure 7F:
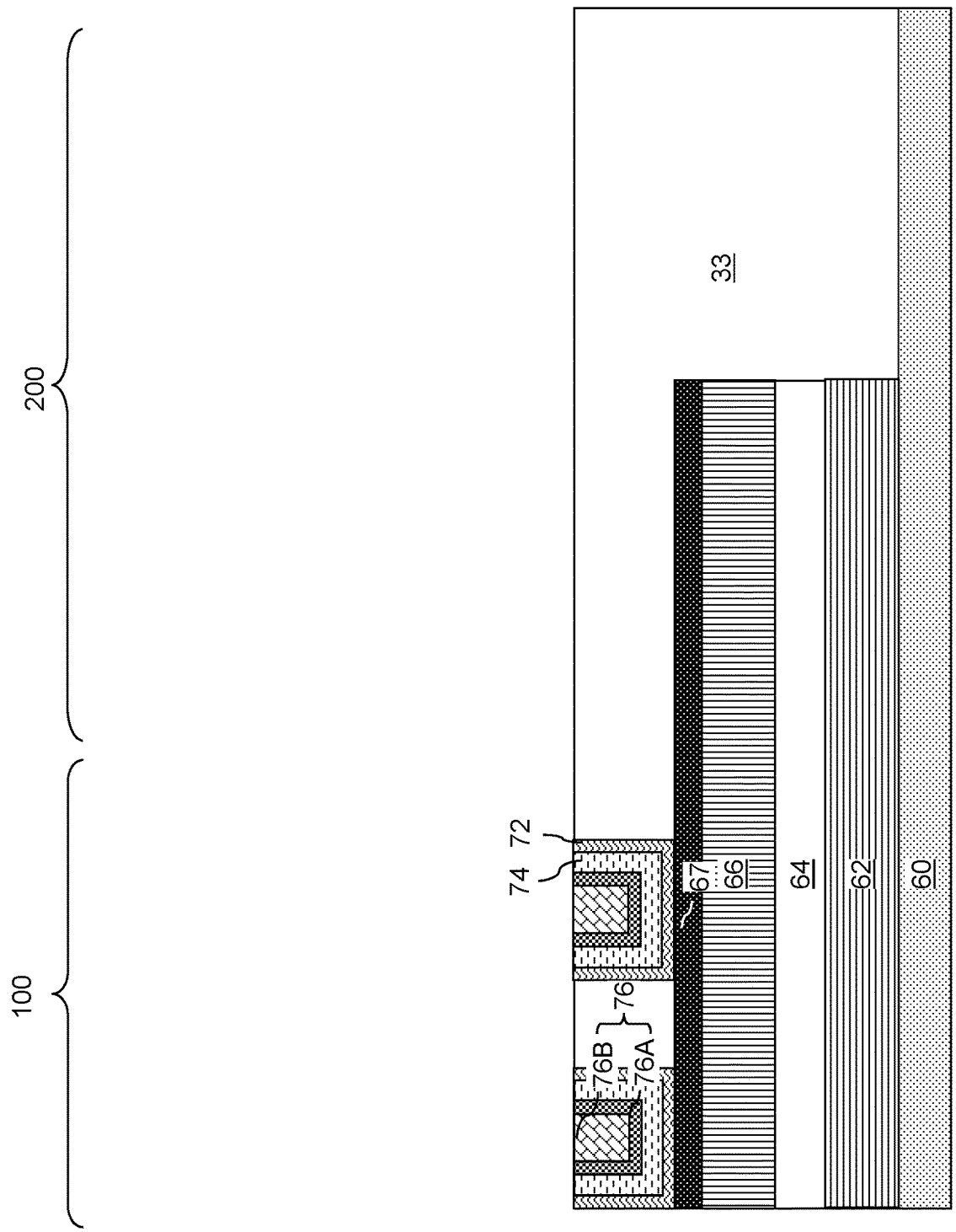
FIG. 7F is a vertical cross-sectional view of a portion of the exemplary structure around a boundary between a memory array region and the peripheral region at the processing steps of FIGS. 7A-7E.

Referring to FIGS. 2A and 2B, a portion of a memory array region 100 according to an embodiment of the present disclosure is illustrated after formation of a layer stack (60, 62L, 64L, 66L, 67L) including a middle etch stop layer 60, a lower bit line material layer 62L, an inter-bit-line dielectric layer 64L, an upper bit line material layer 66L, and a dielectric cap material layer 67L.

The middle etch stop layer 60 includes an etch stop dielectric material such as silicon nitride, silicon oxynitride, or a dielectric metal oxide. Other suitable materials within the contemplated scope of disclosure may also be used. The middle etch stop layer 60L may be formed by a conformal or non-conformal deposition process. For example, the middle etch stop layer 60L can be formed by plasma enhanced chemical vapor deposition (PECVD). The thickness of the middle etch stop layer 60 can be in a range from 5 nm to 50 nm, although lesser and greater thicknesses can also be used.

The lower bit line material layer 62L includes a conductive material. According to an aspect of the present disclosure, the lower bit line material layer 62L may include a carbon-based conductive material containing hybridized carbon atoms in a hexagonal arrangement. Generally, carbon atoms can be arranged in a two-dimensional hexagonal arrangement to form a conductive structure including σ-bonds selected from hybridized $sp^2$ orbitals and include π-bonds selected from unhybridized p orbitals. Such hybridized carbon atoms in hexagonal arrangement can be wrapped around to form carbon nanotubes, or may remain planar to form graphene sheets. In case the lateral extent of a graphene sheet is less than 50 nanometers, such a graphene sheet is referred to as graphene nanoribbons. Generally, the carbon-based conductive material can include carbon nanotubes and/or graphene in sheets or nanoribbons.

The carbon-based conductive material may be partially oxidized or doped with dopants, or may remain undoped. Various dopants that may be introduced into the carbon-based conductive material include, but are not limited to, Be, B, N, O, and/or F. The carbon-based conductive material can include carbon atoms at an atomic percentage of at least 95%, which may be at least 97% and/or at least 99%. The carbon-based conductive material may consist essentially of carbon if undoped, or may include carbon at an atomic percentage in a range from 95% to 99.9999%. The carbon-based conducive material may be provided as single-walled carbon nanotubes, as multi-walled carbon nanotubes, graphene nanoribbons, graphene sheets having a lateral dimension greater than 50 microns at least along one direction, or a mixture or a stack thereof. In one embodiment, the carbon-based conductive material can include, and/or can consist essentially of, doped graphene nanoribbons including dopants such as Be, B, N, 0, and/or F. The carbon-based conductive material can provide lower resistance than copper, cobalt, and ruthenium at a line width less than 20 nm due to the two-dimensional transport properties provided by the hexagonal arrangement of the carbon atoms and accompanying π-bonds selected from unhybridized p orbitals.

The carbon-based conductive material can be formed using a suitable deposition process. For example, if the carbon-based conductive material includes nitrogen-doped graphene nanoribbons, the carbon-based conductive material can be deposited by performing a plasma enhanced chemical vapor deposition process using 1, 3, 5-triazine $(HCN)_3$ as a precursor gas at a process temperature in a range from 300 degrees Celsius to 700 degrees Celsius. A plasma treatment process using ammonia and/or nitrogen dioxide gas can be performed after deposition of the carbon-based conductive material to provide nitrogen atoms as dopants.

The thickness of the carbon-based conductive material of the lower bit line material layer 62L can be in a range from 5 nm to 30 nm, although lesser and greater thicknesses can also be used.

In an alternative embodiment, the lower bit line material layer 62L can include a metallic material such as a conductive metallic nitride (such as TiN, TaN, or WN) or a combination of a conductive metallic nitride and an elemental metal (such as W, Cu, Co, Mo, or Ru). Other suitable materials within the contemplated scope of disclosure may also be used. In an embodiment, the thickness of the lower bit line material layer 62L may be in a range from 5 nm to 50 nm, although lesser and greater thicknesses can also be used. If a carbon-based conductive material is used for the lower bit line material layer 62L, the high conductivity (i.e., the low resistivity) of the carbon-based conductive material allows reduction of the thickness of the lower bit line material layer 62L.

The inter-bit-line dielectric layer 64L and the upper bit line material layer 46L are optional structures that may be present to form a dual-layer array of resistive memory elements, or may be omitted to form a single-layer array of resistive memory elements. While the present disclosure is described using an embodiment that described a dual-layer array of resistive memory elements, embodiments are expressly contemplated herein in which the inter-bit-line dielectric layer 64L and the upper bit line material layer 46L are omitted and a single-layer array of resistive memory elements is formed in lieu of a dual-layer array of resistive-memory elements.

The inter-bit-line dielectric layer 64L may include a dielectric material such as silicon oxide, silicon oxynitride, and/or a low-k dielectric material such as organosilicate glass. Other suitable materials within the contemplated scope of disclosure may also be used. The inter-bit-line dielectric layer 64L can be formed by a conformal or non-conformal deposition process, and can have a thickness in a range from 5 nm to 30 nm, although lesser and greater thicknesses can also be used.

The upper bit line material layer 66L includes a conductive material, which can be any material that may be used for the lower bit line material layer 62L. In one embodiment, both the lower bit line material layer 62L and the upper bit line material layer 66L can include a respective carbon-based conductive material. In this case, the carbon-based conductive material of the upper bit line material layer 66L may be the same as, or may be different from, the carbon-based conductive material of the lower bit line material layer 62L. Alternatively, only one of the lower bit line material layer 62L and the upper bit line material layer 66L can include a carbon-based conductive material, and another of the lower bit line material layer 62L and the upper bit line material layer 66L can include at least one metallic material such as a conductive metallic nitride material (e.g., TiN, TaN, or WN). Other suitable materials within the contemplated scope of disclosure may also be used.

In embodiments in which the upper bit line material layer 66L includes a carbon-based conductive material, the upper bit line material layer 66L can have a thickness in a range from 5 nm to 30 nm, although lesser and greater thicknesses can also be used. In embodiments in which the upper bit line material layer 66L includes at least one metallic material, the upper bit line material layer 66L can have a thickness in a range from 5 nm to 50 nm, although lesser and greater thicknesses can also be used. Generally, a carbon-based conductive material can decrease the thickness of the lower bit line material layer 62L and/or the upper bit line material layer 66L if used for any, or each, of the lower bit line material layer 62L and the upper bit line material layer 66L.

The dielectric cap material layer 67L includes a dielectric material that can function as an etch stop material during a subsequent anisotropic etch process. For example, the dielectric cap material layer 67L includes silicon nitride, silicon carbide, or a dielectric metal oxide. The dielectric cap material layer 67L can have a thickness in a range from 5 nm to 20 nm, although lesser and greater thicknesses can also be used.

Referring to FIGS. 3A-3E, a photoresist layer 69 can be applied over the dielectric cap material layer 67L, and can be lithographically patterned in a line and space pattern. The line and space pattern in the photoresist layer 69 can be transferred through the dielectric cap material layer 67L, the upper bit line material layer 66L, the inter-bit-line dielectric layer 64L, and the lower bit line material layer 62L by an anisotropic etch process that uses the photoresist layer 69 as an etch mask. The middle etch stop layer 60 can be used as an etch stop structure for the anisotropic etch process. In one embodiment, unmasked portions of the middle etch stop layer 60 can be vertically recessed by a recess depth that is about the same as the sum of a thickness of a resistive memory material layer to be subsequently formed and a thickness of a selector material layer to be subsequently formed.

In one embodiment, the line and space pattern in the photoresist layer 69 can include straight edges that laterally extend along a first horizontal direction hd1. Further, the line and space pattern in the photoresist layer 69 can be a periodic pattern that is repeated along a second horizontal direction hd2 with a periodicity, i.e., the pitch of a unit pattern that is the same as the sum of the width of a patterned strip of the photoresist layer 69 and a spacing between a pair of patterned strips of the photoresist layer 69.

A rail structure (62, 64, 66, 67) can be formed by each set of remaining material portions of the dielectric cap material layer 67L, the upper bit line material layer 66L, the inter-bit-line dielectric layer 64L, and the lower bit line material layer 62L that underlie a respective patterned strip of the photoresist layer 69. Each rail structure (62, 64, 66, 67) can include, from bottom to top, a lower bit line 62, an inter-bit-line dielectric rail 64, an upper bit line 66, and a dielectric cap strip 67. Each lower bit line 62 is a patterned portion of the lower bit line material layer 62L. Each inter-bit-line dielectric rail 64 is a patterned portion of the inter-bit-line dielectric layer 64L. Each upper bit line 66 is a patterned portion of the upper bit line material layer 66L. Each dielectric cap strip 67 is a patterned portion of the dielectric cap material layer 67L. The rail structures (62, 64, 66, 67) can be arranged as a one-dimensional periodic array of rail structures (62, 64, 66, 67). Each rail structure (62, 64, 66, 67) can have a width (as measured at the bottom) in a range from 10 nm to 100 nm. The spacing between each laterally neighboring pair of rail structures (62, 64, 66, 67) can be in a range from 20 nm to 100 nm, although lesser and greater spacings can also be used.

Each rail structure (62, 64, 66, 67) can include a pair of vertical or substantially vertical lengthwise sidewalls that laterally extend along the first horizontal direction. In one embodiment, each rail structure (62, 64, 66, 67) can include a pair of vertical lengthwise sidewalls, and all components of each rail structure (62, 64, 66, 67) can have a same horizontal cross-sectional shape, which may be a rectangular shape. In another embodiment, each rail structure (62, 64, 66, 67) can include a pair of tapered lengthwise sidewalls having a taper angle in a range from 0 degree to 5 degrees.

In this case, components of each rail structure (62, 64, 66, 67) can have different horizontal cross-sectional shapes having a lesser width that decreases with a vertical distance from the substrate 8.

Each rail structure (62, 64, 66, 67) within the array of rail structures (62, 64, 66, 67) can laterally extend along the first horizontal direction hd1. Each of the rail structures (62, 64, 66, 67) comprises at least one bit line (62, 66), which may include a lower bit line 62 and an upper bit line 66, or may include only a lower bit line 62 which is herein referred to as a bit line. At least a subset of the bit lines (62, 66) (which may include the lower bit lines 62 and/or the upper bit lines 66) can include, and/or can consist essentially of, a carbon-based conductive material containing hybridized carbon atoms in a hexagonal arrangement.

In one embodiment, one of a lower bit line 62 and an upper bit line 66 within each rail structure (62, 64, 66, 67) can include, and/or can consist essentially of, a carbon-based conductive material, and another of the lower bit line 62 and the upper bit line 66 within each rail structure (62, 64, 66, 67) can include, and/or can consist essentially of, a conductive material other than the carbon-based conductive material, such as at least one metallic material (e.g., a conductive metallic nitride and/or an elemental metal). In another embodiment, both the respective lower bit line 62 and the respective upper bit line 66 within each rail structure (62, 64, 66, 67) can include, and/or can consist essentially of, a respective carbon-based conductive material. The photoresist layer 69 can be subsequently removed, for example, by ashing.

Referring to FIGS. 4A-4E, a dielectric isolation material layer 70 can be formed over the one-dimensional array of rail structures (62, 64, 66, 67). In one embodiment, the dielectric isolation material layer 70 may be formed as the third interconnect-level dielectric layer 33 described above. The dielectric isolation material layer 70 includes a planarizable dielectric material such as silicon oxide. Other suitable materials within the contemplated scope of disclosure may also be used. The dielectric isolation material layer 70 can be formed by a self-planarizing process such as spin-on coating, or can be formed by a conformal deposition process such as chemical vapor deposition. In case the dielectric isolation material layer 70 is formed by a conformal deposition process, a planarization process such as chemical mechanical planarization can be performed to provide a planar horizontal top surface for the dielectric isolation material layer 70. The top surface of the dielectric material layer 70 can be located entirely within a first horizontal plane that overlies a second horizontal plane containing top surfaces of the dielectric cap strips 67. The vertical distance between the first horizontal plane and the second horizontal plane can be in a range from 15 nm to 300 nm, such as from 30 nm to 150 nm.

Referring to FIGS. 5A-5E, a photoresist layer (not shown) can be applied over the dielectric isolation material layer 70, and can be lithographically patterned to form a line and space pattern. The line and space pattern in the photoresist layer can be transferred through the dielectric isolation material layer 70 by an anisotropic etch process that uses the photoresist layer as an etch mask. The dielectric cap strips 67 and the middle etch stop layer 60 can be used as etch stop structures for the anisotropic etch process.

In one embodiment, the line and space pattern in the photoresist layer can include straight edges that laterally extend along the second horizontal direction hd2, which can be perpendicular to the first horizontal direction hd1. Further, the line and space pattern in the photoresist layer can be a periodic pattern that is repeated along the first horizontal direction hd1 with a periodicity, i.e., the pitch of a unit pattern that is the same as the sum of the width of a patterned strip of the photoresist layer and a spacing between a pair of patterned strips of the photoresist layer.

Each patterned portion of the dielectric isolation material layer 70 constitutes a dielectric isolation structure 133, which may be a remaining portion of the third interconnect-level dielectric layer 33. Each dielectric isolation structure 133 can have a uniform width along the first horizontal direction hd1, and can laterally extend along the second horizontal direction hd2. Each dielectric isolation structure 133 can have a width (as measured at the bottom) in a range from 10 nm to 100 nm. The spacing between each laterally neighboring pair of dielectric isolation structures 133 can be in a range from 20 nm to 100 nm, although lesser and greater spacings can also be used.

Each dielectric isolation structure 133 can have a pair of vertical or substantially vertical lengthwise sidewalls. Each dielectric isolation structure 133 can include a horizontally-extending portion located above the horizontal plane including the top surfaces of the dielectric cap strips 67, and a row of downward-protruding portions that protrude downward from the horizontally-extending portion. Each downward-protruding portion of a dielectric isolation structure 133 can contact sidewalls of a pair of rail structures (62, 64, 66, 67). Each sidewall of a rail structure (62, 64, 66, 67) can contact a sidewall of a respective downward-protruding portion of each of the dielectric isolation structures 133. Line trenches 71 may be formed between each neighboring pair of dielectric isolation structures 133. Sidewalls of the rail structures (62, 64, 66, 67) are physically exposed to the line trenches 71. Each line trench 71 can include a horizontally-extending portion that overlies the horizontal plane including the top surfaces of the dielectric cap strips 67, and a row of vertically-extending portions that extend downward from the horizontally-extending portion.

Referring to FIGS. 6A-6E, a continuous resistive memory material layer 72L and a continuous selector material layer 74L can be formed in the line trenches 71 and over the dielectric isolation structures 133. The continuous resistive memory material layer 72L includes a resistive memory material that can have at least two different resistive states. In one embodiment, the continuous resistive memory material layer 72L can include a phase change memory material that can provide two different resistive states depending on the crystalline structure. For example, the continuous resistive memory material layer 72L can include a germanium-antimony-tellurium alloy that provides a low resistance state in a polycrystalline phase and a high resistance state in an amorphous phase. Alternatively, the continuous resistive memory material layer 72L can include a vacancy-modulated conductive oxide material. For example, the continuous resistive memory material layer 72L can include a titanium oxide material that provides a low resistance state having a narrow oxygen depletion region and a high resistance state having a wide oxygen depletion region. The continuous resistive memory material layer 72L can be formed by a conformal deposition process such as chemical vapor deposition. The thickness of the continuous resistive memory material layer 72L can be in a range from 3 nm to 20 nm, although lesser and greater thicknesses can also be used.

The continuous selector material layer 74L includes a selector material that can provide electrical connection or electrical disconnection depending on an applied bias voltage thereacross. In one embodiment, the continuous selector material layer 74L can include a phase change memory material that can provide two different resistive states depending on the crystalline structure. For example, the continuous selector material layer 74L can include an ovonic threshold switch material that functions as a conductor under a voltage bias thereacross that exceeds a threshold switching voltage, and functions as an insulator under a voltage bias thereacrosss that is less than the threshold switching voltage. For example, the continuous selector material layer 74L can include a chalcogenide alloy including selenium or tellurium and at least another element such as zinc, germanium, silicon, and optionally includes sulfur and/or nitrogen. In one embodiment, the continuous selector material layer 74L can include zinc telluride or zinc selenide telluride. Alternatively, the continuous selector material layer 74L can include a p-n junction diode material, which can include at least one layer stack of a p-doped semiconductor material and an n-doped semiconductor material. The continuous selector material layer 74L can be formed by a conformal deposition process such as chemical vapor deposition. The thickness of the continuous selector material layer 74L can be in a range from 3 nm to 30 nm, although lesser and greater thicknesses can also be used.

Generally, each of the continuous resistive memory material layer 72L and the continuous selector material layer 74L can be formed by a respective conformal deposition process. Each of the continuous resistive memory material layer 72L and the continuous selector material layer 74L can be formed as a respective continuous material layer extending continuously over each rail structure (62, 64, 66, 67) within the array of rail structures (62, 64, 66, 67) and into each of the line trenches 71. A line cavity 71' can be present within each line trench 71 after formation of the continuous resistive memory material layer 72L and the continuous selector material layer 74L. While the present disclosure is described using an embodiment in which the continuous selector material layer 74L is formed on the continuous resistive memory material layer 72L, embodiments are expressly contemplated herein in which the continuous selector material layer 74L is deposited first, and the continuous resistive memory material layer 72L is deposited on the continuous selector material layer 74L.

Referring to FIGS. 7A-7F, at least one conductive material can be deposited within the line cavities 71'. For example, a metallic nitride liner 76A including a conductive metallic nitride material (such as TiN, TaN, or WN) can be conformally deposited on the physically exposed surfaces of the layer stack of the continuous resistive memory material layer 72L and the continuous selector material layer 74L, for example, by chemical vapor deposition. The thickness of the metallic nitride liner 76A can be in a range from 2 nm to 10 nm, although lesser and greater thicknesses can also be used. At least one metallic fill material such as Cu, W, Co, Mo, Ru, another elemental metal, or an alloy or a stack thereof can be deposited in remaining volumes of the line cavities 71'. Other suitable materials within the contemplated scope of disclosure may also be used. Each line cavity 71' can be filled with the at least one conductive material. Excess portions of the at least one conductive material that overlie the horizontal plane including the top surfaces of the dielectric isolation structures 133 can be removed by a planarization process. For example, a chemical mechanical planarization (CMP) process can be performed to remove the at least one conductive material from above the horizontal plane including the top surfaces of the dielectric isolation structures 133. Top surfaces of the dielectric isolation structures 133 can be used as stopping surfaces during the planarization process.

Each remaining portion of the at least one conductive material filling a line trench 71 constitutes a word line 76. Each word line 76 can include a metallic nitride liner 76A and a metallic fill material portion 76B. Each metallic fill material portion 76B is a remaining portion of the at least one metallic fill material (which may include Cu, W, Co, Mo, Ru, and/or another elemental metal).

Horizontal portions of the continuous resistive memory material layer 72L and the continuous selector material layer 74L that overlie the horizontal plane including the top surfaces of the dielectric isolation structures 133 can be collaterally removed during the planarization process. A layer stack of a resistive memory material layer 72 and a selector material layer 74 may be formed within each of the line trenches 71. Each resistive memory material layer 72 may be a patterned portion of the continuous resistive memory material layer 72L. Each selector material layer 74 may be a patterned portion of the continuous selector material layer 74L. A word line 76 may be formed on each of the layer stacks (72, 74) within unfilled volumes of the line trenches 71, i.e., within volumes that are not filled with the layer stacks (72, 74). Each segment of the resistive memory material layers 72 located between a neighboring pair of a word line 76 selected from the word lines 76 and a bit line (62 or 66) selected from the lower bit lines 62 and the upper bit lines 66 constitutes a resistive memory element.

Dielectric isolation structures 133 can be located between each neighboring pair of the word lines 76. The dielectric isolation structures 177 can include a respective horizontally-extending portion that overlie the rail structures (62, 64, 66, 67) and a respective row of downward-protruding portions that protrude downward between neighboring pairs of the rail structures (62, 64, 66, 67). The word lines 76 and the dielectric isolation structures 133 can form a laterally alternating sequence that alternate along the first horizontal direction hd1, and can have top surfaces that are located within a same horizontal plane.

In one embodiment, each rail structure (62, 64, 66, 67) can include a respective vertical stack of a lower bit line 62, an inter-bit-line dielectric rail 64, an upper bit line 67, and a dielectric cap strip 67. Word lines 76 can laterally extend along the second horizontal direction hd2 that is perpendicular to the first horizontal direction hd1, which is the lengthwise direction of the vertical stacks of the rail structures (62, 64, 66, 67). Each of the word lines 76 includes a respective horizontally-extending portion that overlie each of the vertical stacks of the rail structures (62, 64, 66, 67) and a respective row of downward-protruding portions that protrude downward from the respective horizontally-extending portion between neighboring pairs of the vertical stacks of the rail structures (62, 64, 66, 67). A layer stack (72, 74) of a resistive memory material layer 72 and a selector material layer 74 can be located between each of the word lines 76 and each sidewall of the vertical stacks of the rail structures (62, 64, 66, 67).

Further, a layer stack (72, 74) of a resistive memory material layer 72 and a selector material layer 74 can be located between each of the word lines 76 and respective underlying portions of the array of rail structures (62, 64, 66, 67). Each layer stack (72, 74) can continuously extend over each rail structure (62, 64, 66, 67) within the array of rail structures (62, 64, 66, 67), and can contact sidewalls of each bit line (62, 66) within the array of rail structures (62, 64, 66, 67). At least a subset of the bit lines (62, 66) can include, and/or can consist essentially of, a carbon-based conductive material containing hybridized carbon atoms in a hexagonal arrangement.

Figure 8:
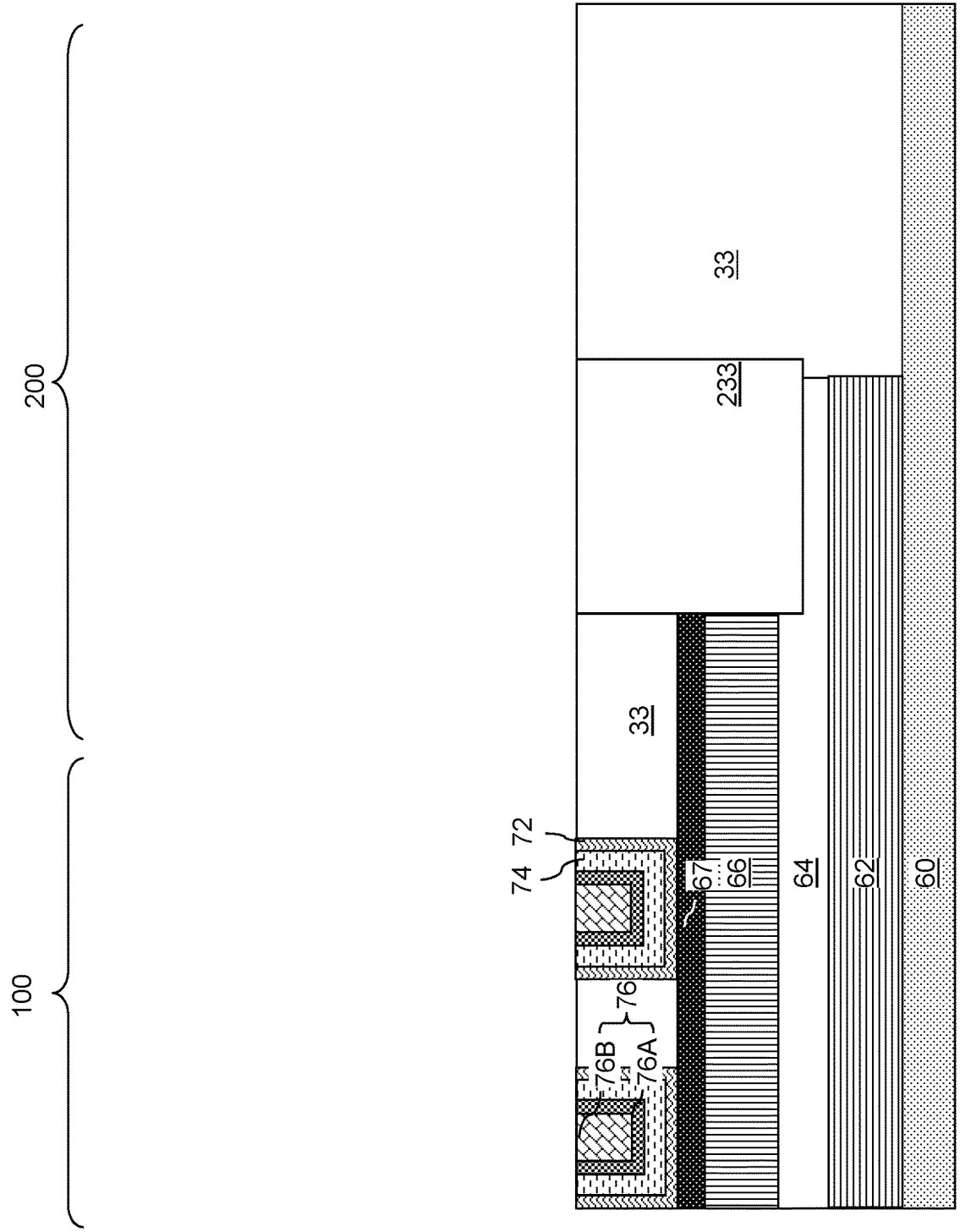
FIG. 8 is a vertical cross-sectional view of a portion of the exemplary structure around a boundary between a memory array region and the peripheral region after pattering an end segment of the rail structures according to an embodiment of the present disclosure.

Referring to FIG. 8, an end portion of each upper bit line 66 can be removed without removing underlying portions of the lower bit lines 62. As discussed above, the third interconnect-level dielectric layer 33 may comprise the dielectric isolation material layer 70, and the dielectric isolation structures 133 may be portions of the third interconnect-level dielectric layer 33 that are present within the memory array region 100. In one embodiment, each of the rail structures (62, 64, 66, 67) can include a respective end segment that laterally extends into a portion of the peripheral region 200 that borders the memory array region 100. A photoresist layer (not shown) can be applied over the top surface of the third interconnect-level dielectric layer 33, and can be formed to form an opening that overlies the end segments of the rail structures (62, 64, 66, 67).

An anisotropic etch process can be performed to etch through unmasked portions of the third interconnect-level dielectric layer 33, the dielectric cap strips 67, and the upper bit lines 66, and optionally into the inter-bit-line dielectric rails 64. A line trench extending along the second horizontal direction hd2 and cutting through end segments of the upper bit lines 66 can be formed. The line trench can be filled with a dielectric fill material such as silicon oxide or a low-k dielectric material to form a dielectric fill material portion 233. Other suitable materials within the contemplated scope of disclosure may also be used. Horizontal portions of the dielectric fill material may be removed from above the horizontal plane including the top surfaces of the dielectric isolation structures 133. Alternatively, horizontal portions of the dielectric fill material may be added to the third interconnect-level dielectric layer 33 to increase the thickness of the third interconnect-level dielectric layer 33.

Figure 9:
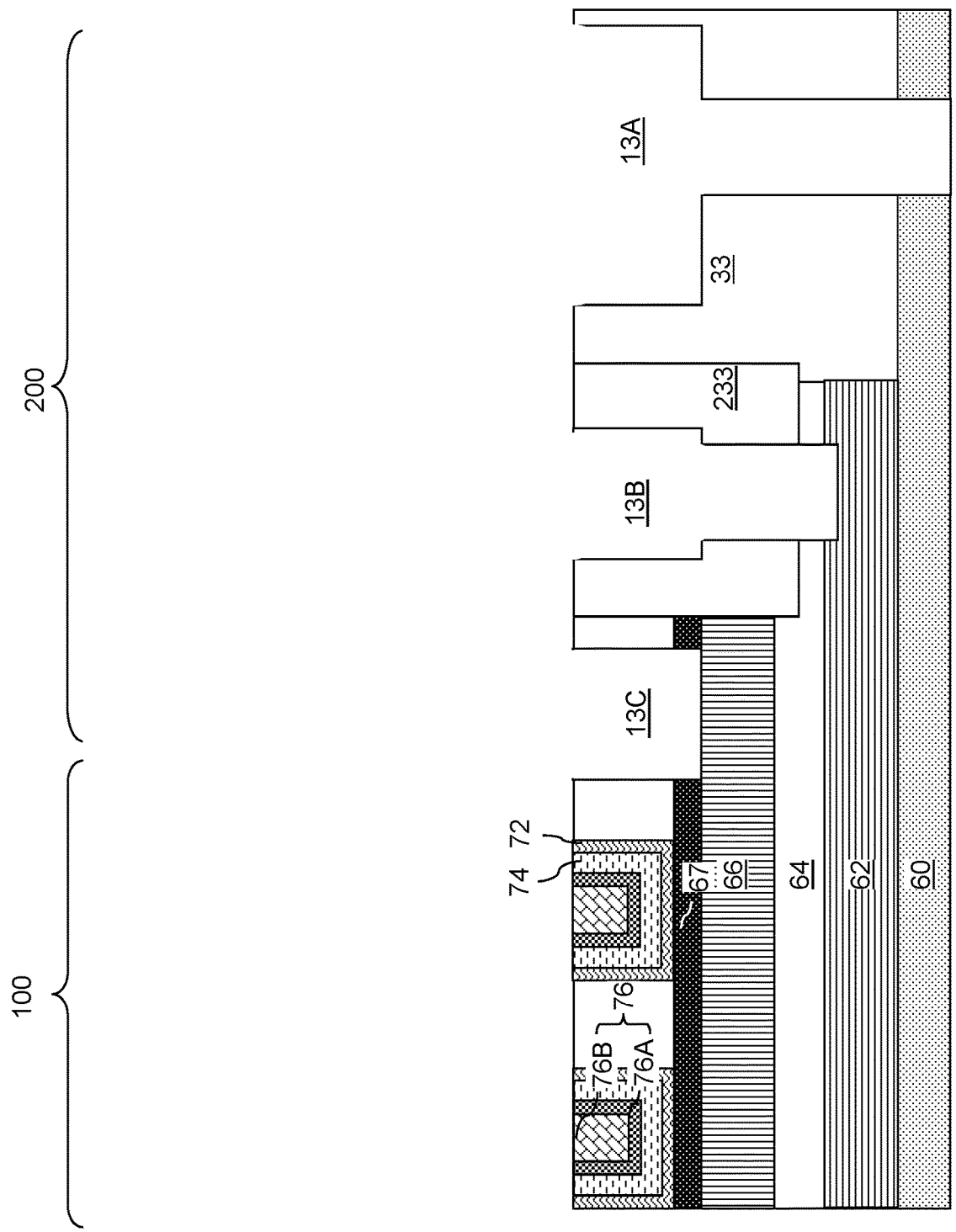
FIG. 9 is a vertical cross-sectional view of a portion of the exemplary structure around a boundary between a memory array region and the peripheral region after formation of various cavities in an interconnect-level dielectric layer according to an embodiment of the present disclosure.

Referring to FIG. 9, combinations of a lithographic patterning process and an anisotropic etch process can be used to form various cavities (13A, 13B, 13C) through the third interconnect-level dielectric layer 33, the dielectric fill material portion 233, and/or the middle etch stop layer 60. For example, a combination of a first lithographic patterning process and a first anisotropic etch process can be used to form via cavities, and a combination of a second lithographic patterning process and a second anisotropic etch process can be used to form line cavities that overlap in area with the via cavities and to vertically extend the via cavities to a respective underlying etch stop structure. The underlying etch stop structures can include the second metal lines 42L, the lower bit lines 62, and the upper bit lines 66. The various cavities (13A, 13B, 13C) can include first integrated line and via cavities 13A under which a top surface of a respective second metal line 42L is physically exposed, second integrated line and via cavities 13B under which a top surface of a respective lower bit line 62 is physically exposed, and line-level cavities 13C under which a top surface of a respective upper bit line 66 is physically exposed. The second integrated line and via cavities 13B can extend through the dielectric fill material portion 233.

Figure 10:
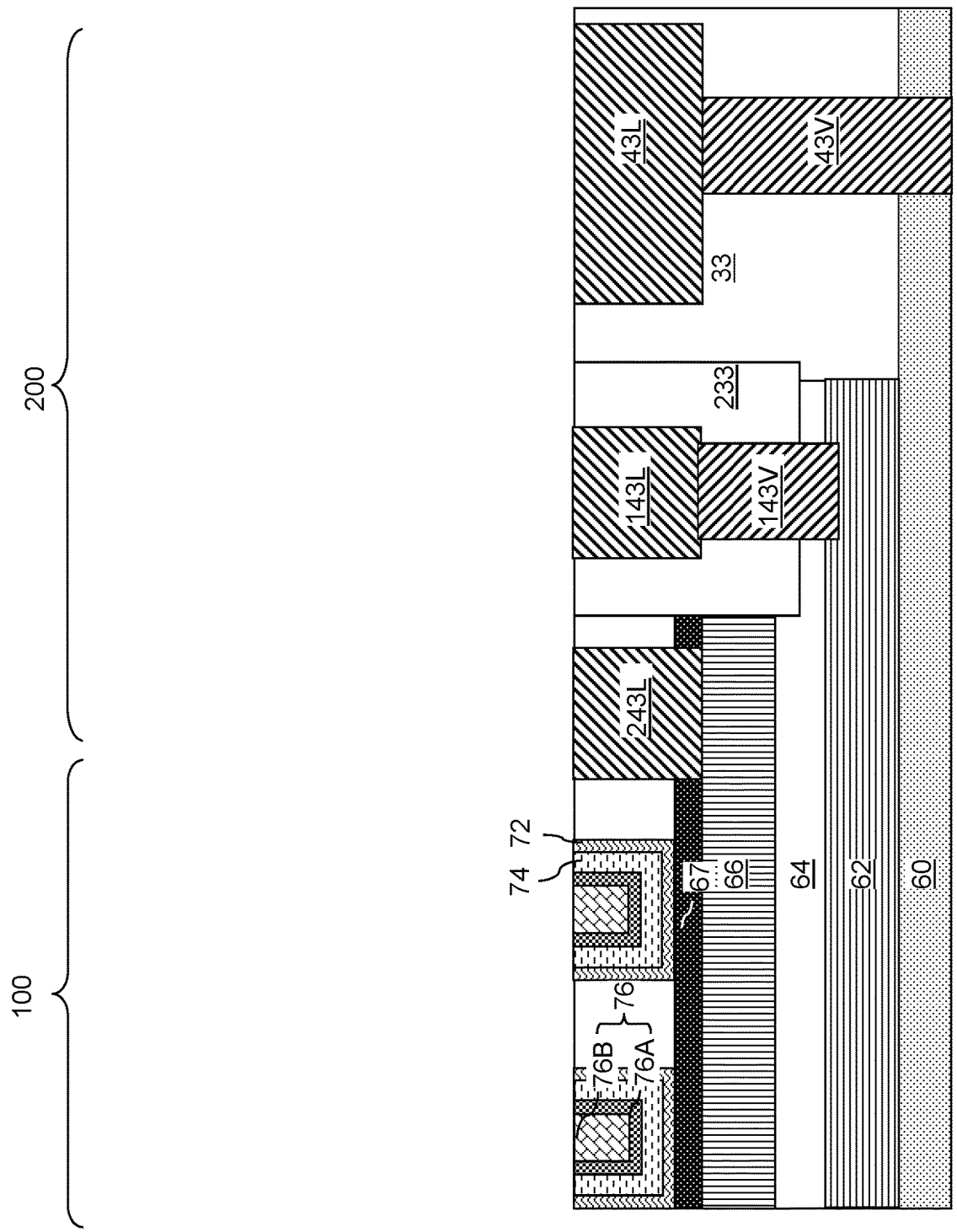
FIG. 10 is a vertical cross-sectional view of a portion of the exemplary structure around a boundary between a memory array region and the peripheral region after formation of metal interconnect structures in the cavities according to an embodiment of the present disclosure.

Referring to FIG. 10, at least one conductive material can be deposited in each of the cavities (13A, 13B, 13C) in the third interconnect-level dielectric layer 33, the dielectric fill material portion 233, and/or the middle etch stop layer 60. The at least one conductive material can include a metallic nitride liner (such as a layer of TiN, TaN, or WN) and a metallic fill material (such as copper or tungsten). Other suitable materials within the contemplated scope of disclosure may also be used. Excess portions of the at least one material can be removed from above the horizontal plane including the top surface of the third interconnect-level dielectric layer 33 by a planarization process such as chemical mechanical planarization.

Each remaining portion of the at least one conductive material filling the first integrated line and via cavities 13A constitutes an integrated line and via structure that include a second metal via structure 43V as a vertically-extending portion and a third metal line 43L as a horizontally-extending portion. Each remaining portion of the at least one conductive material filling the second integrated line and via cavities 13B constitutes an integrated line and via structure, which is herein referred to as a first bit line contact structure (143V, 143L). Each first bit line contact structure (143V, 143L) can include a lower-bit-line contact via structure 143V and a lower-bit-line connection metal line 143L. Each first bit line contact structure (143V, 143L) contacts a top surface of a respective one of the lower bit lines 62. Each remaining portion of the at least one conductive material filling the line-level cavities 13C constitutes a second bit line contact structure 243L. Each second bit line contact structure 243L contacts a respective one of the upper bit lines 66. Each of the first bit line contact structures (143V, 143L), the second bit line contact structures 243L, and the integrated line and via structures (43V, 43L) can include, and/or can consist essentially of, a same set of at least one metal.

Figure 11:
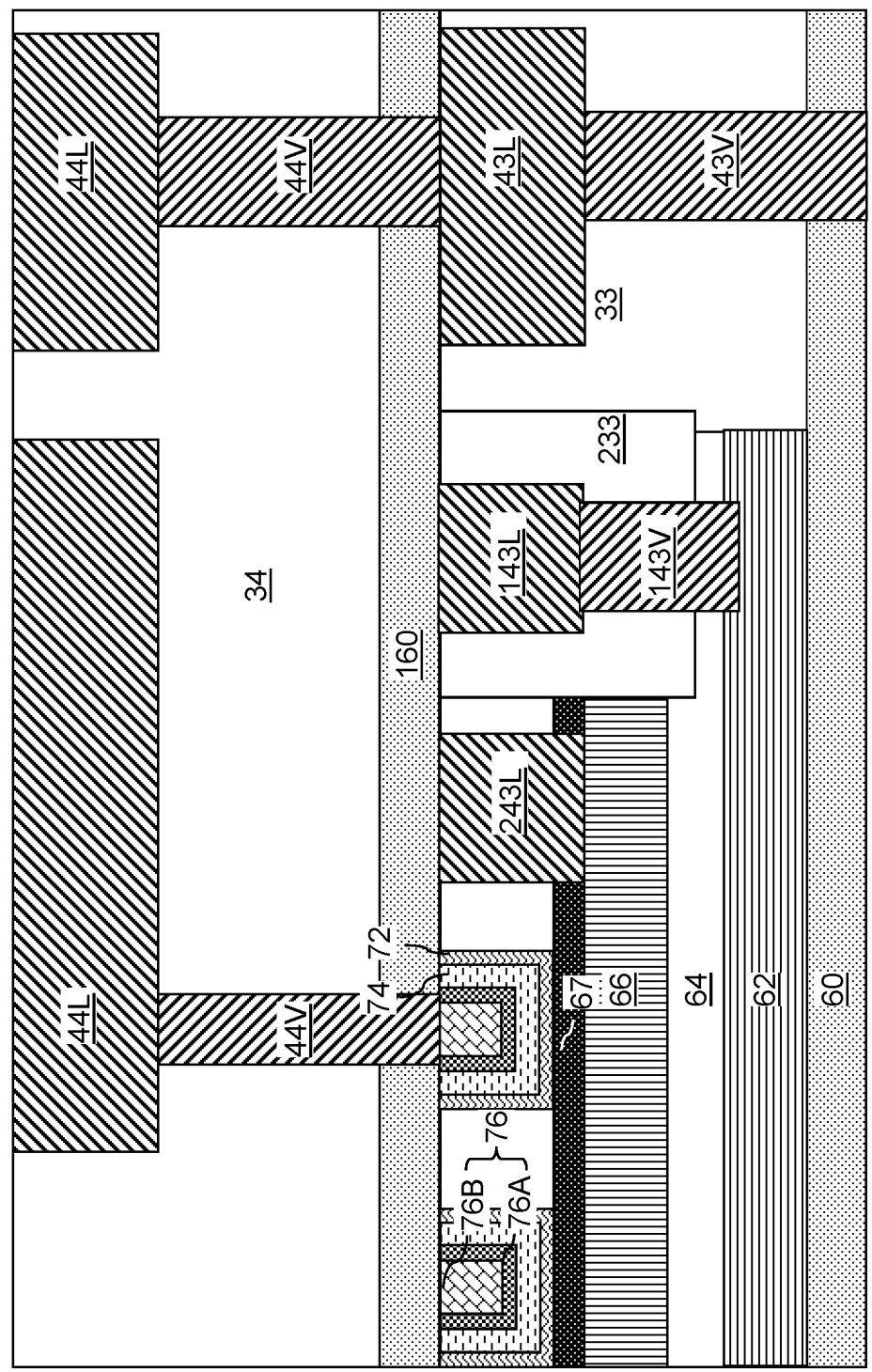
FIG. 11 is a vertical cross-sectional view of a portion of the exemplary structure around a boundary between a memory array region and the peripheral region after formation of an upper interconnect-level dielectric layer and additional metal interconnect structures according to an embodiment of the present disclosure.
Figure 12A:
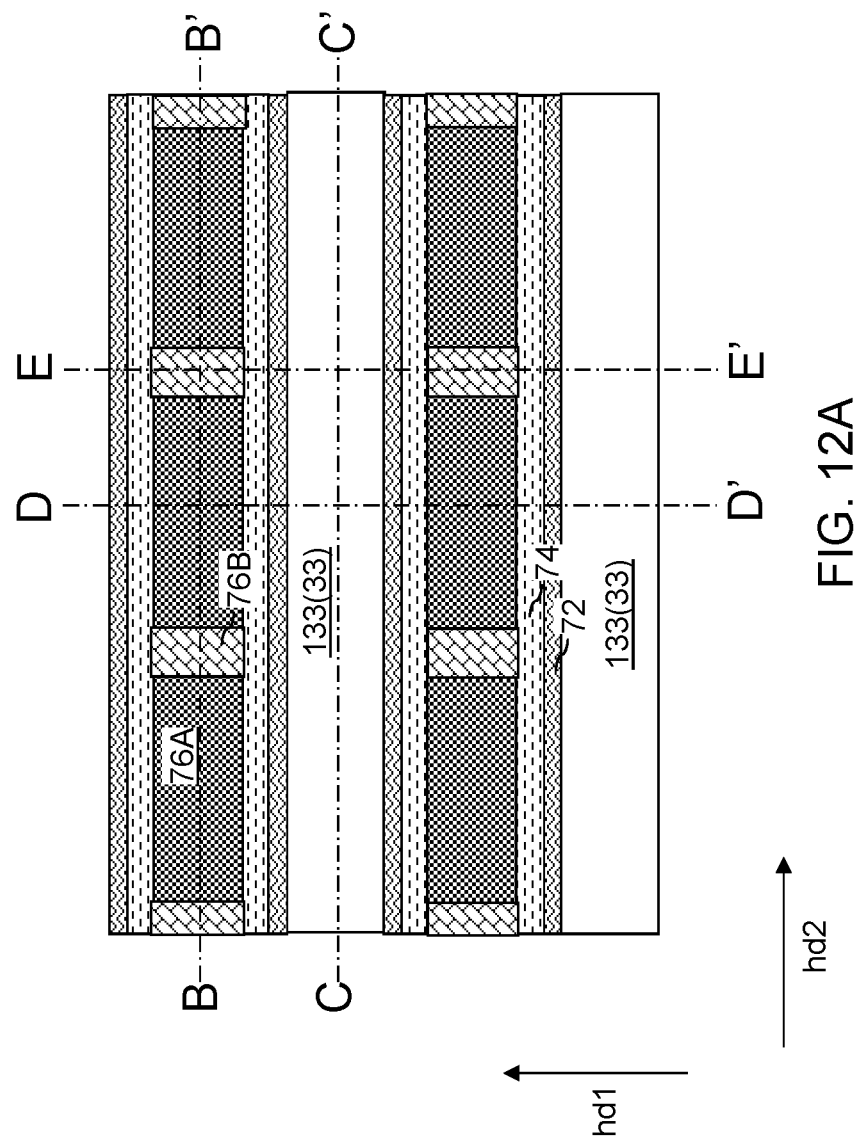
FIG. 12A is a top-down view of a portion of a memory array region after formation of recess cavities by vertically recessing word lines for an alternative configuration of the first exemplary structure according to an embodiment of the present disclosure.
Figure 12B:
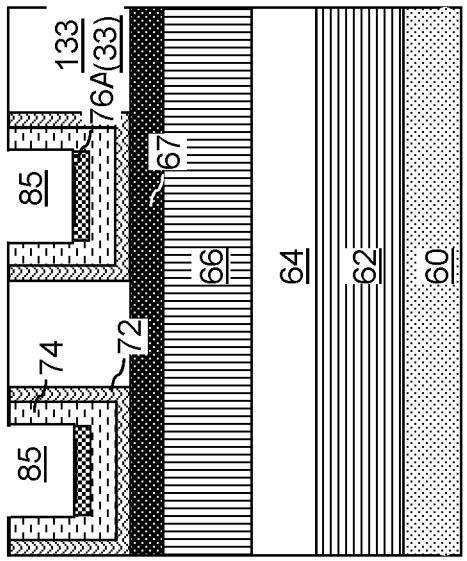
FIG. 12B is a vertical cross-sectional view of the portion of the memory array region along the vertical plane B-B' of FIG. 12A.
Figure 12D:
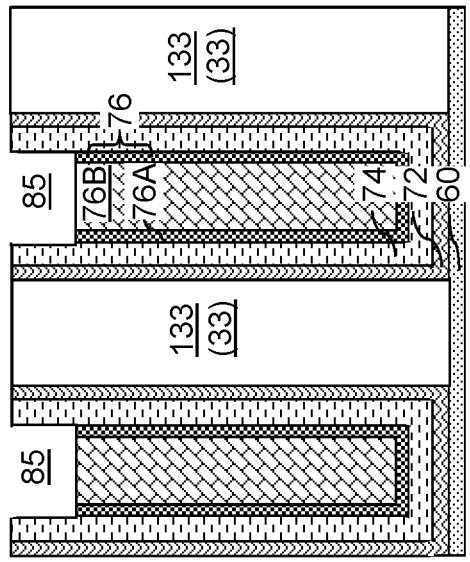
FIG. 12D is a vertical cross-sectional view of the portion of the memory array region along the vertical plane D-D' of FIG. 12A.
Figure 12C:
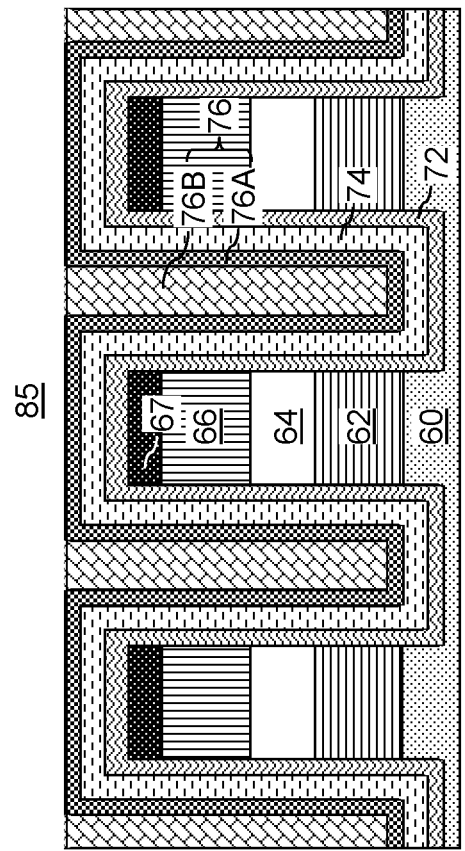
FIG. 12C is a vertical cross-sectional view of the portion of the memory array region along the vertical plane C-C' of FIG. 12A.
Figure 12E:
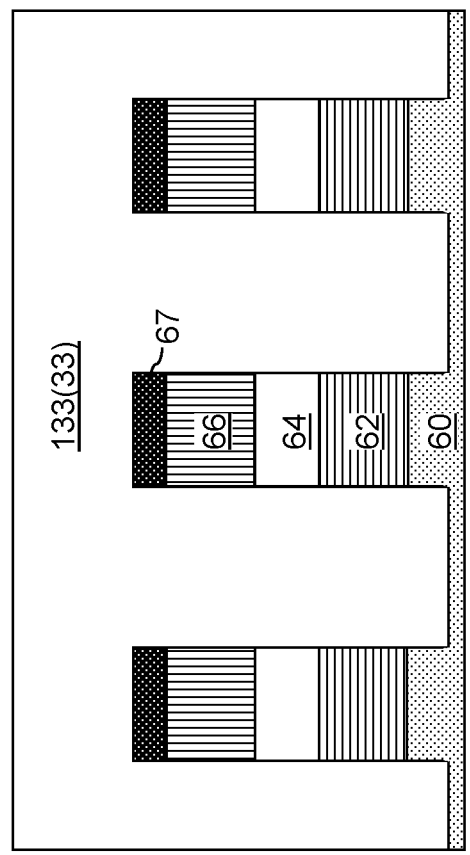
FIG. 12E is a vertical cross-sectional view of the portion of the memory array region along the vertical plane E-E' of FIG. 12A.
Figure 13A:
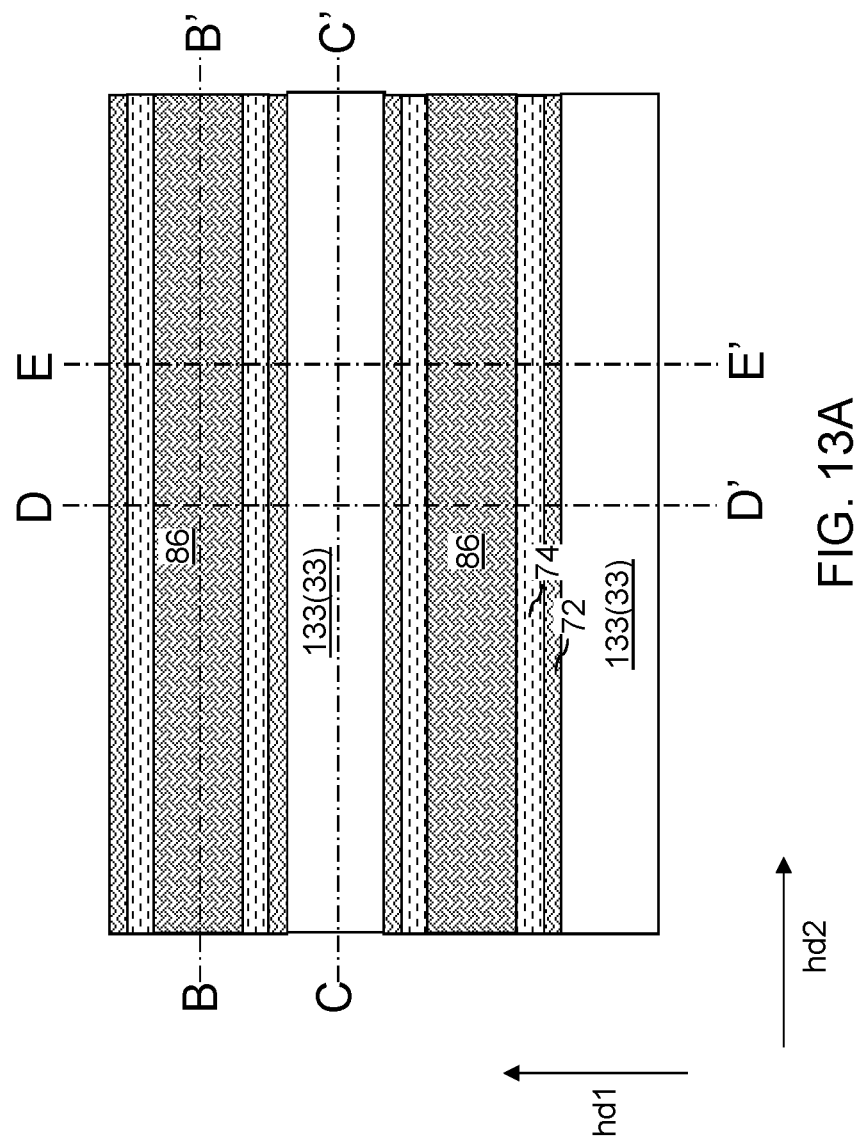
FIG. 13A is a top-down view of the portion of the memory array region after formation of upper word line portions containing a carbon-based conductive material in the recess cavities for the alternative configuration of the first exemplary structure according to an embodiment of the present disclosure.
Figure 13D:
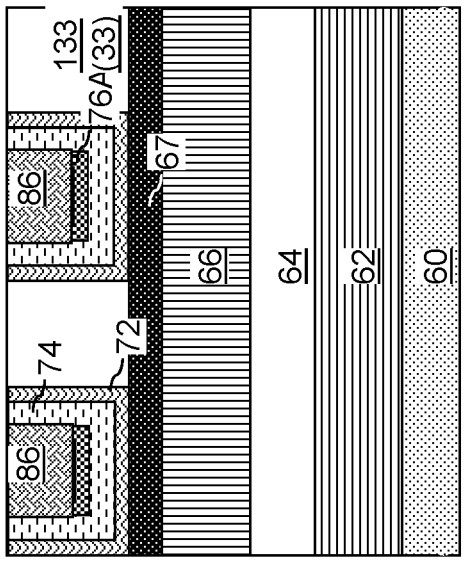
FIG. 13D is a vertical cross-sectional view of the portion of the memory array region along the vertical plane D-D' of FIG. 13A.
Figure 13E:
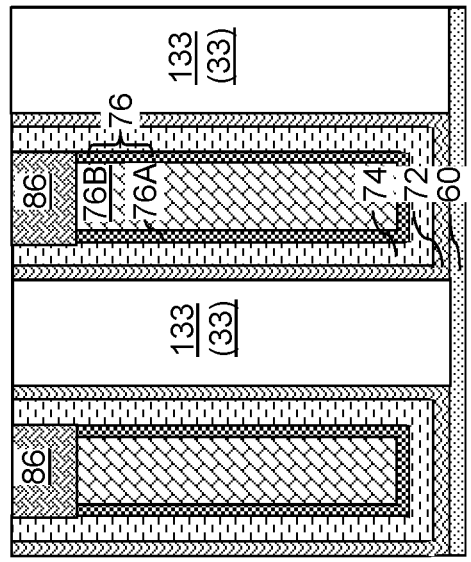
FIG. 13E is a vertical cross-sectional view of the portion of the memory array region along the vertical plane E-E' of FIG. 13A.
Figure 13B:
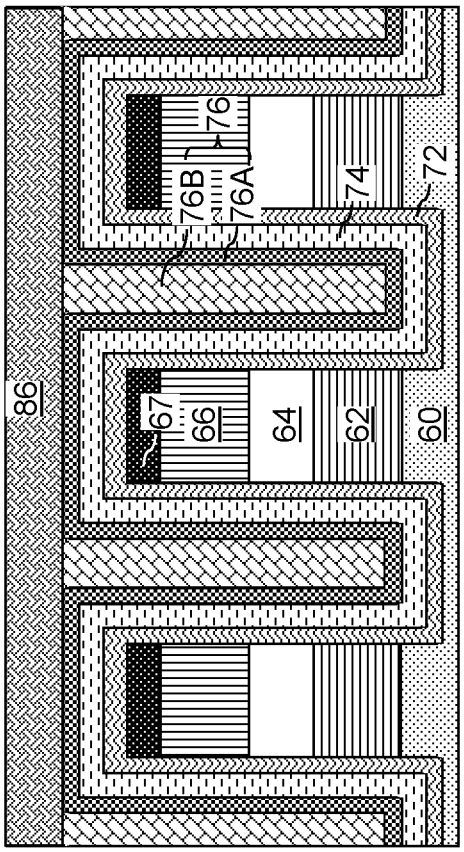
FIG. 13B is a vertical cross-sectional view of the portion of the memory array region along the vertical plane B-B' of FIG. 13A.
Figure 13C:
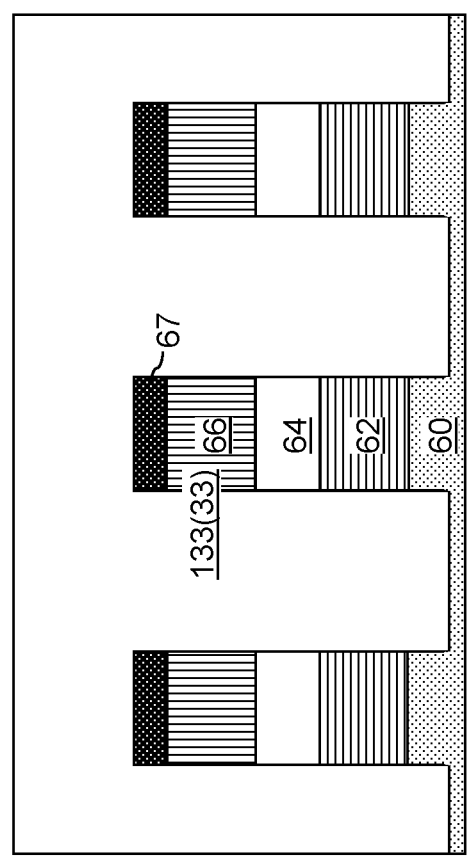
FIG. 13C is a vertical cross-sectional view of the portion of the memory array region along the vertical plane C-C' of FIG. 13A.

Referring to FIG. 11, an additional middle etch stop dielectric layer 160 and a fourth interconnect-level dielectric layer 34 can be formed above the third interconnect-level dielectric layer 33. Fourth interconnect-level metal interconnect structures (44V, 44L) can be formed through the fourth interconnect-level dielectric layer 34 and the additional middle etch stop dielectric layer 160. The fourth interconnect-level metal interconnect structures (44V, 44L) can include third metal via structures 44V and fourth metal lines 44L. The third metal via structures 44 can contact a top surface of a respective one of the third metal lines 43L, the first bit line contact structure (143V, 143L), the second bit line contact structures 243L, and the word lines 76. Subsequently, additional processing steps described above can be performed to provide the first exemplary structure illustrated in FIG. 1C.

Referring to FIGS. 12A-12E, an alternative configuration for the first exemplary structure can be derived from the first exemplary structure illustrated in FIGS. 7A-7F by vertically recessing the word lines 76 selective to the dielectric isolation structures 133. The vertical recessing of the word lines 76 may, or may not, be selective to the materials of the resistive memory material layers 72 and the selector material layers 72. The top surface of each word line 76 can be vertically recessed such that a recess cavity 85 can continuously extend over each of the rail structures (62, 64, 66, 67) along the second horizontal direction hd2. In one embodiment, horizontal surfaces of the metallic nitride liners 76A can be physically exposed above each of the rail structures (62, 64, 66, 67).

Referring to FIGS. 13A-13E, the recess cavities 85 can be filled with a carbon-based conductive material. The carbon-based conductive material that can be deposited in the recess cavities 85 can be any of the carbon-based conductive material that may be used for the lower bit lines 62 and/or the upper bit lines 66 that are described above. Excess portions of the carbon-based conductive material can be removed from above the horizontal plane including the top surfaces of the dielectric isolation structures 133 (which can be portions of the third interconnect-level dielectric layer 33) using a planarization process such as a chemical mechanical planarization process. Each remaining portion of the carbon-based conductive material that fills a respective recess cavity 85 constitutes a carbon-based conductive material rail 86 that extends along the second horizontal direction hd2 over each of the vertical stacks in the rail structures (62, 64, 66, 67). In one embodiment, the carbon-based conductive material of the carbon-based conductive material rail 86 can be selected from carbon nanotubes and graphene in sheets or nanoribbons. Each carbon-based conductive material rail 86 is incorporated into a respective word line (76A, 76B, 86).

In one embodiment, a horizontally-extending portion of each word line (76A, 76B, 86) can comprise the carbon-based conductive material (comprising a carbon-based conductive material rail 86), and the downward-protruding portions of each word line (76A, 76B, 86) can comprise at least one metallic material (comprising a combination of a metallic nitride liner 76A and a metallic fill material portion 76B). In one embodiment, the word lines (76, 86) or at least a subset of the bit lines (62, 66) may comprise a carbon-based conductive material containing hybridized carbon atoms in a hexagonal arrangement. Alternatively, the bit lines (62, 66) can include only at least one metallic material, and may be free of any carbon-based conductive material.

FIGS. 14A-14E illustrate a sequence of processing steps that can be used to form a second exemplary structure including multiple array of resistive memory elements formed within multiple interconnect-level structures.

Figure 14A:
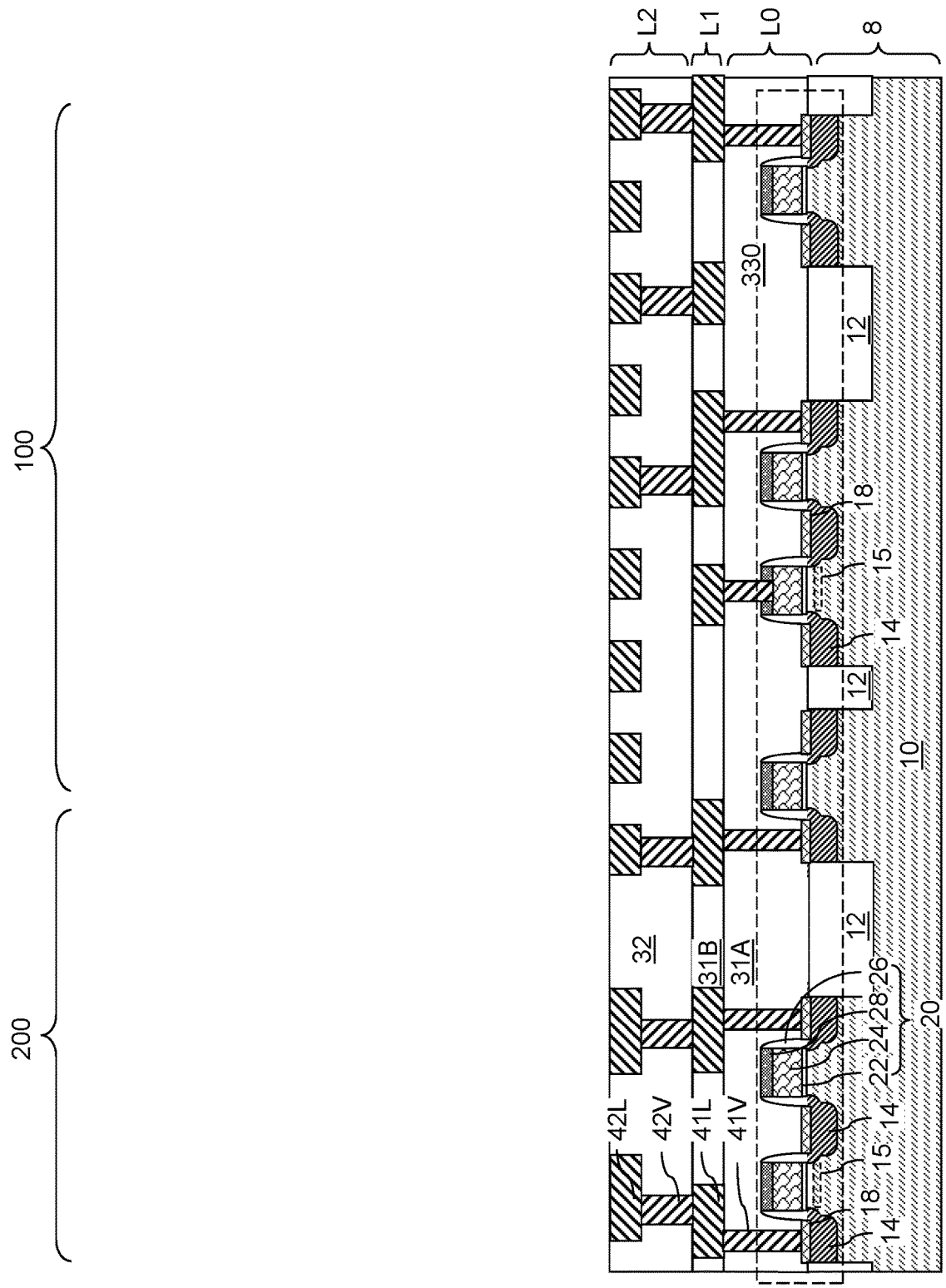
FIG. 14A is a vertical cross-sectional view of a second exemplary structure during prior to formation of a first array of resistive memory elements according to an embodiment of the present disclosure.

Referring to FIG. 14A, the second exemplary structure prior to formation of any array of resistive memory elements may be the same as the first exemplary structure illustrated in FIG. 1A.

Figure 14B:
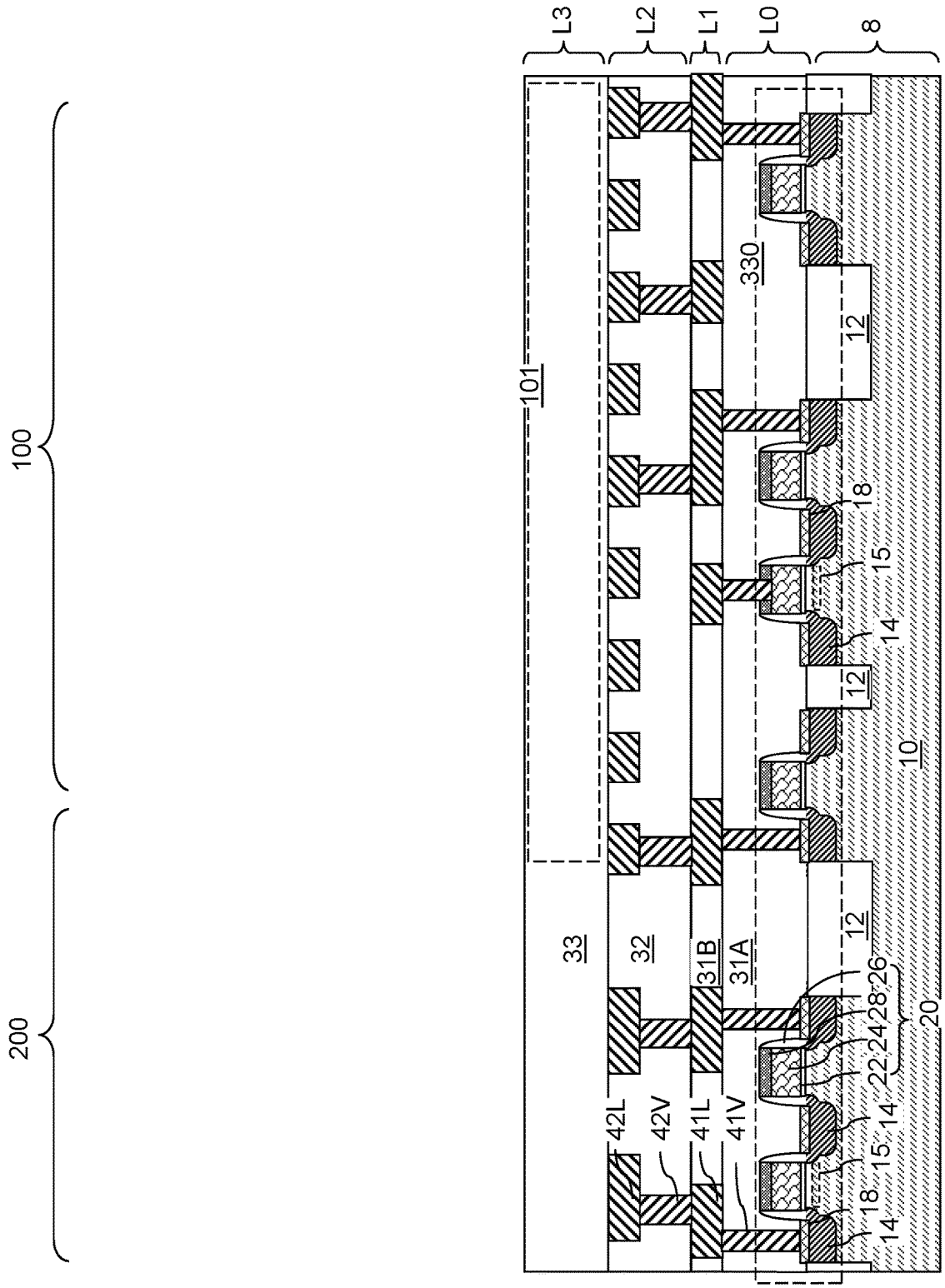
FIG. 14B is a vertical cross-sectional view of the second exemplary structure during after formation of the first array of resistive memory elements according to an embodiment of the present disclosure.

Referring to FIG. 14B, the second exemplary structure after formation of an array 101 of resistive memory elements can be the same as the first exemplary structure illustrated in FIG. 1B. The array 101 of resistive memory elements is hereafter referred to as a first array 101 of resistive memory elements, and may incorporate any of the structures for the array of resistive memory elements described above, such as the structures illustrated in FIGS. 7A-7F or in FIGS. 13A-13E.

Figure 14C:
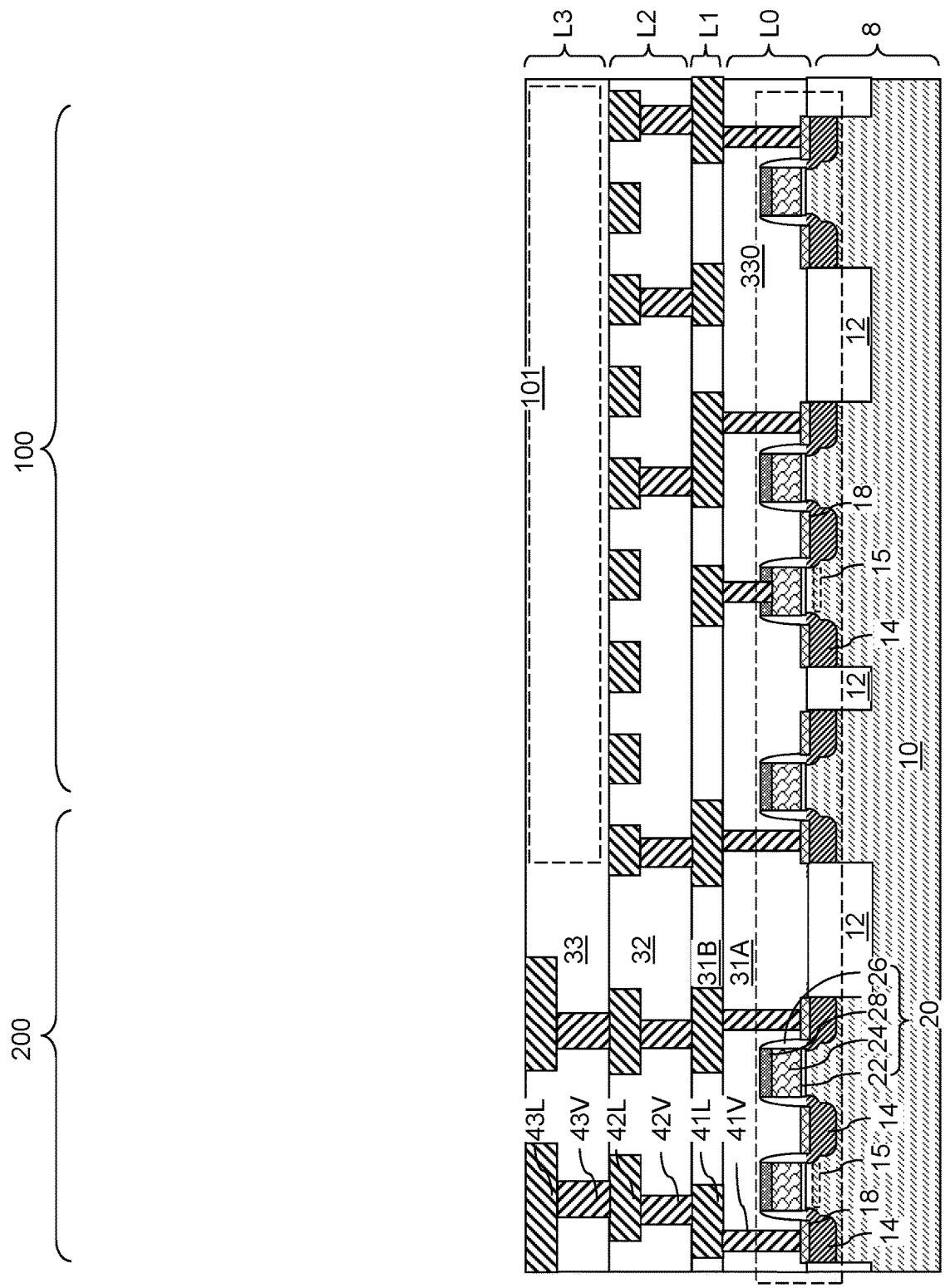
FIG. 14C is a vertical cross-sectional view of the second exemplary structure during after formation of the metal interconnect structures at the level of the first array of resistive elements according to an embodiment of the present disclosure.

Referring to FIG. 14C, the processing steps of FIGS. 8-10 can be performed to form various metal interconnect structures within the third interconnect-level dielectric layer 33. For example, the first bit line contact structures (143V, 143L), the second bit line contact structures 243L, and the integrated line and via structures (43V, 43L) described above can be formed.

Referring to FIG. 14D, the processing steps of FIGS. 2A-7F can be repeated at the level of the fourth interconnect-level dielectric layer 34 to form a second array 201 of resistive memory elements. The second array 201 of resistive memory elements may include a same set of elements as the first array 101 of resistive memory elements with necessary modifications in the geometry and orientation of various elements for the purpose of optimizing the layout.

Generally, a plurality of resistive memory arrays may be sequentially formed at different levels of metal interconnect structures 40 over the substrate 8. The plurality of resistive memory arrays can be located at different levels, and can overlie, or underlie, each other or one another. For example, the second array 201 of resistive memory elements can be formed within an interconnect-level dielectric layer that overlies the interconnect-level dielectric layer that covers the first array 101 of resistive memory elements.

Figure 14E:
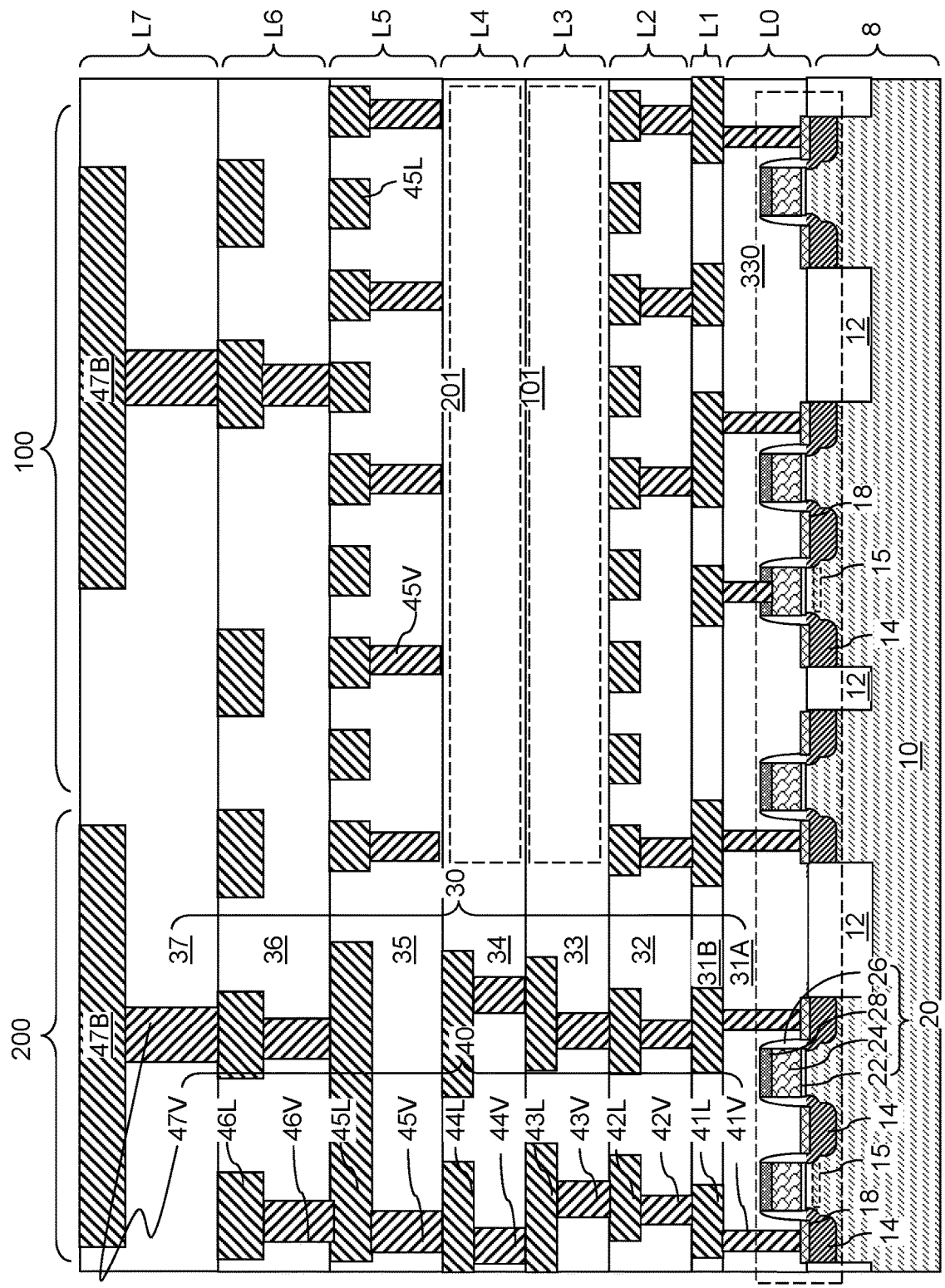
FIG. 14E is a vertical cross-sectional view of the second exemplary structure during after formation of upper-level metal interconnect structures according to an embodiment of the present disclosure.

Referring to FIG. 14E, additional processing steps described in conjunction with FIG. 1C may be performed to form various metal interconnect structures within the fourth interconnect-level dielectric layer 34, and to form upper interconnect-level structures (L5, L6, L7).

Figure 15:
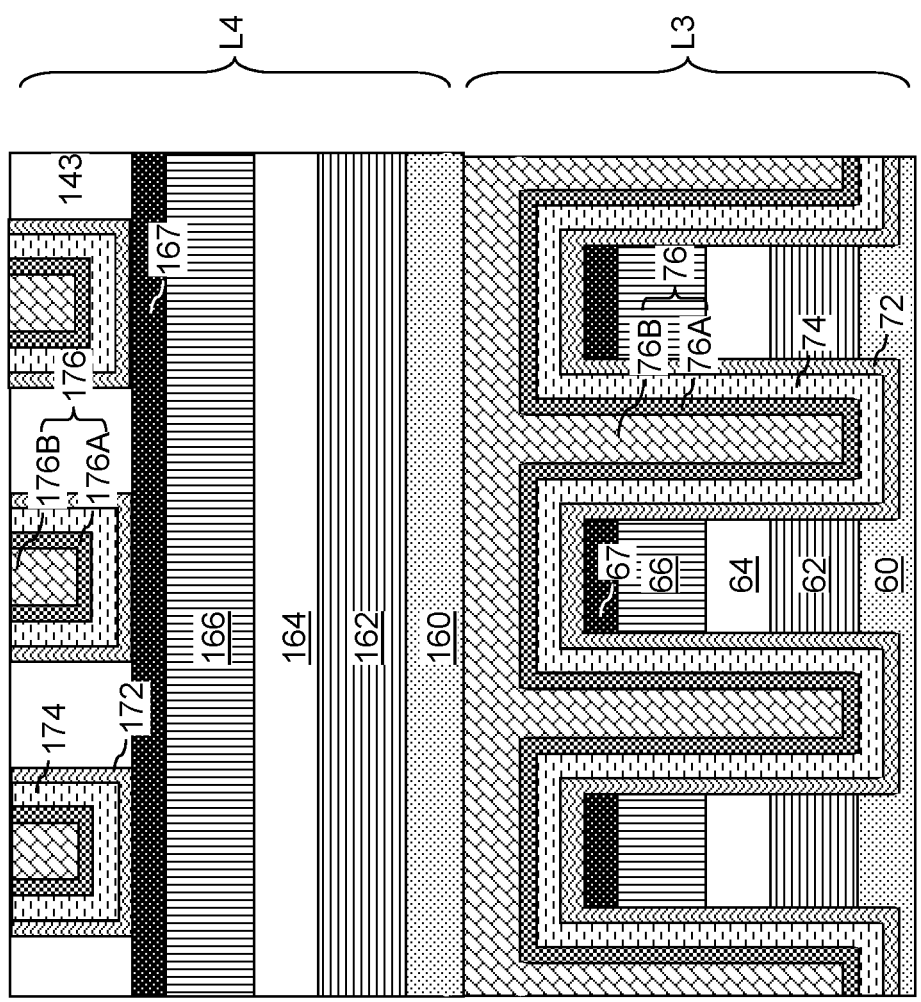
FIG. 15 is a vertical cross-sectional view of a portion of a memory array region in the structure of FIG. 14E.

Referring to FIG. 15, a vertical cross-sectional view of a portion of the third interconnect-level structure L3 and the fourth interconnect-level structure L4 within the memory array region 100 is illustrated. Optionally, the lengthwise direction of the rail structures (162, 164, 166, 167) in the fourth interconnect-level structure L4 may be perpendicular to the lengthwise direction of the rail structures (62, 64, 66, 67) in the third interconnect-level structure L3. Each rail structure (162, 164, 166, 167) in the fourth interconnect-level structure L4 can include a vertical stack of a lower bit line 162, an inter-bit-line rail structure 164, an upper bit line 166, and a dielectric cap strip 167. The fourth interconnect-level structure L4 can include a middle etch stop layer 160, an array of rail structures (162, 164, 166, 167), layer stacks including a respective resistive memory material layer and a selector material layer, dielectric isolation structures 143 that extend along a horizontal direction that is perpendicular to the lengthwise direction of the rail structures (162, 164, 166, 167) within the fourth interconnect-level structure L4, and word lines 176 including at least a respective metallic nitride liner 176A and a metallic fill material portion 176B and optionally a respective carbon-based conductive material rail.

Figure 16:
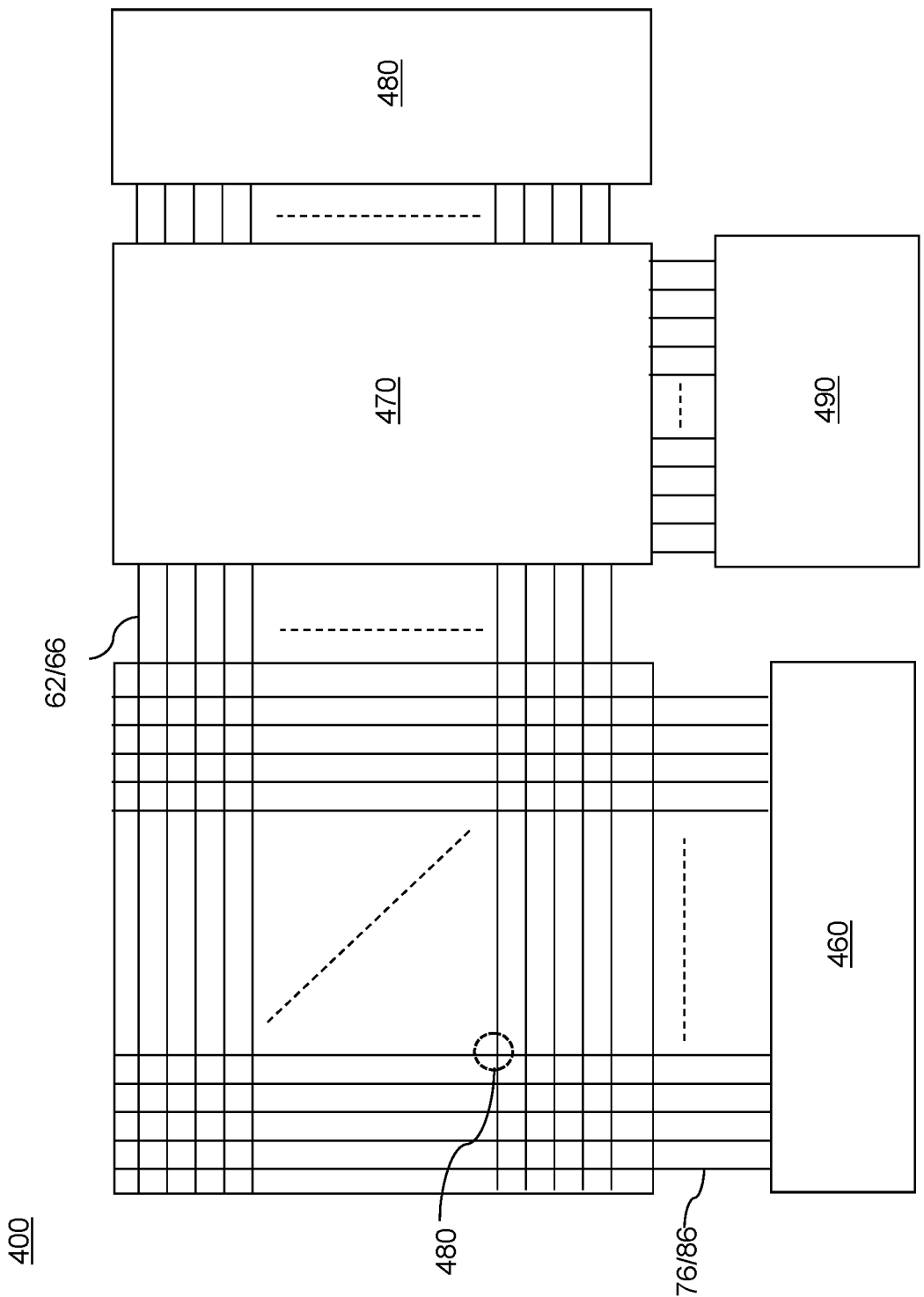
FIG. 16 is a schematic diagram of a resistive random access memory array according to an embodiment of the present disclosure.

Referring to FIG. 16, a schematic diagram of a resistive random access memory (RRAM) device 400 according to an embodiment of the present disclosure. The RRAM device 400 can incorporate a two-dimensional array (101, 201) of resistive memory elements described above. Each resistive memory cell 480 can include a respective portion of a layer stack (72, 74) of a resistive memory material layer 72 and a selector material layer 74 that is located within a neighboring pair of a word line (76 and optionally 86) and a bit line (62 or 66).

The RRAM device 400 of an embodiment of the present disclosure may also contain a row decoder 460 connected to the word lines (76, 86), a sense circuitry 470 (e.g., a sense amplifier and other bit line control circuitry) connected to the bit lines (62, 66), a column decoder 480 connected to the bit lines (62, 66) through the sense circuitry 470, and a data buffer 490 connected to the sense circuitry 470. The configuration of the RRAM device 400 of the present disclosure is only exemplary, and other configurations can also be used for the RRAM device of the present disclosure.

In a typical configuration in which bit lines may be formed using conventional materials (e.g., W, Cu), the conventional metals possess a high bulk conductivity. However, as the thickness of the bit line is scaled down, the bulk conductivity decreases and results in a high line resistance. In addition, use of conventional metals often utilize a barrier layer (e.g., TiN/TaN). While the conductivity of the barrier layer may be low, its presence increases the thickness of the bit line. The various embodiments disclosed herein utilize a carbon based conductive material for formation of at least a subset of the word lines (e.g., 76, 86) and/or bit lines (e.g., 62, 66). In some embodiments, the word lines and bit lines may be formed of different materials. In other embodiments the word lines and bit lines may be formed of the same material. By using a carbon based conductive material, the thickness of the bit line may be reduced. In addition, the need for barrier layers (e.g., TiN, TaN) may be eliminated. Thus, the overall thickness of the bit line may be significantly reduced. For example, in some embodiments the thickness of the bit line may be reduced to 5-20 nm. The carbon based conductive material provides better conductivity and a better thermal stability than those of conventional metals (e.g., W, CU). The memory cell disclosed for use in the various embodiments may include stacked graphene bit lines, a selector, a memory layer, and a metal word lines. The stability of graphene may prevent unwanted oxygen absorption. Moreover, in instances in which the stacked memory layers have a fixed height, the increased thickness of the bit line that utilizes conventional metals then results in a reduced thickness of the inter-bit line dielectric layer. Consequently, with the reduced thickness of the inter-bi line dielectric layer, the likelihood of parasitic capacitance having an impact may be increased.

Referring to FIGS. 1A-16 and according to various embodiments of the present disclosure, a resistive memory device is provided, which includes an array of rail structures (62, 64, 66, 67) that extend along a first horizontal direction hd1. Each of the rail structures (62, 64, 66, 67) includes at least one bit line (62, 66). The array of rail structures (62, 64, 66, 67) includes word lines (76 and optionally 86) that laterally extend along a second horizontal direction hd2 and are laterally spaced apart along the first horizontal direction hd1. Each of the word lines (76 and optionally 86) includes a respective horizontally-extending portion that overlie the rail structures (62, 64, 66, 67) and a respective row of downward-protruding portions that protrude downward from the respective horizontally-extending portion. A layer stack (72, 74) of a resistive memory material layer 72 and a selector material layer 74 is located between each of the word lines (76 and optionally 86) and respective underlying portions of the array of rail structures (62, 64, 66, 67). The word lines (76 and optionally 86) or at least a subset of the bit lines (62, 66) comprise a carbon-based conductive material containing hybridized carbon atoms in a hexagonal arrangement.

According to an aspect of the present disclosure, a memory device comprising at least one resistive memory array (101, 201) located over a substrate 8 is provided. Each of the at least one resistive memory array (101, 201) comprises vertical stacks (62, 64, 66, 67) of a respective lower bit line 62, a respective inter-bit-line dielectric rail 64, and a respective upper bit line 66, and word lines (76 and optionally 86) that laterally extend along a horizontal direction that is perpendicular to a lengthwise direction of the vertical stacks (62, 64, 66, 67). Each of the word lines (76 and optionally 86) includes a respective horizontally-extending portion that overlie each of the vertical stacks (62, 64, 66, 67) and a respective row of downward-protruding portions that protrude downward from the respective horizontally-extending portion between neighboring pairs of the vertical stacks (62, 64, 66, 67). A layer stack of a resistive memory material layer 72 and a selector material layer 74 can be located between each of the word lines (76 and optionally 86) and each sidewall of the vertical stacks (62, 64, 66, 67). At least one set selected from a set of the word lines (76 and optionally 86), a set of the lower bit lines 62, and a set of the upper bit lines 66 comprises a carbon-based conductive material containing hybridized carbon atoms in a hexagonal arrangement.

Figure 17:
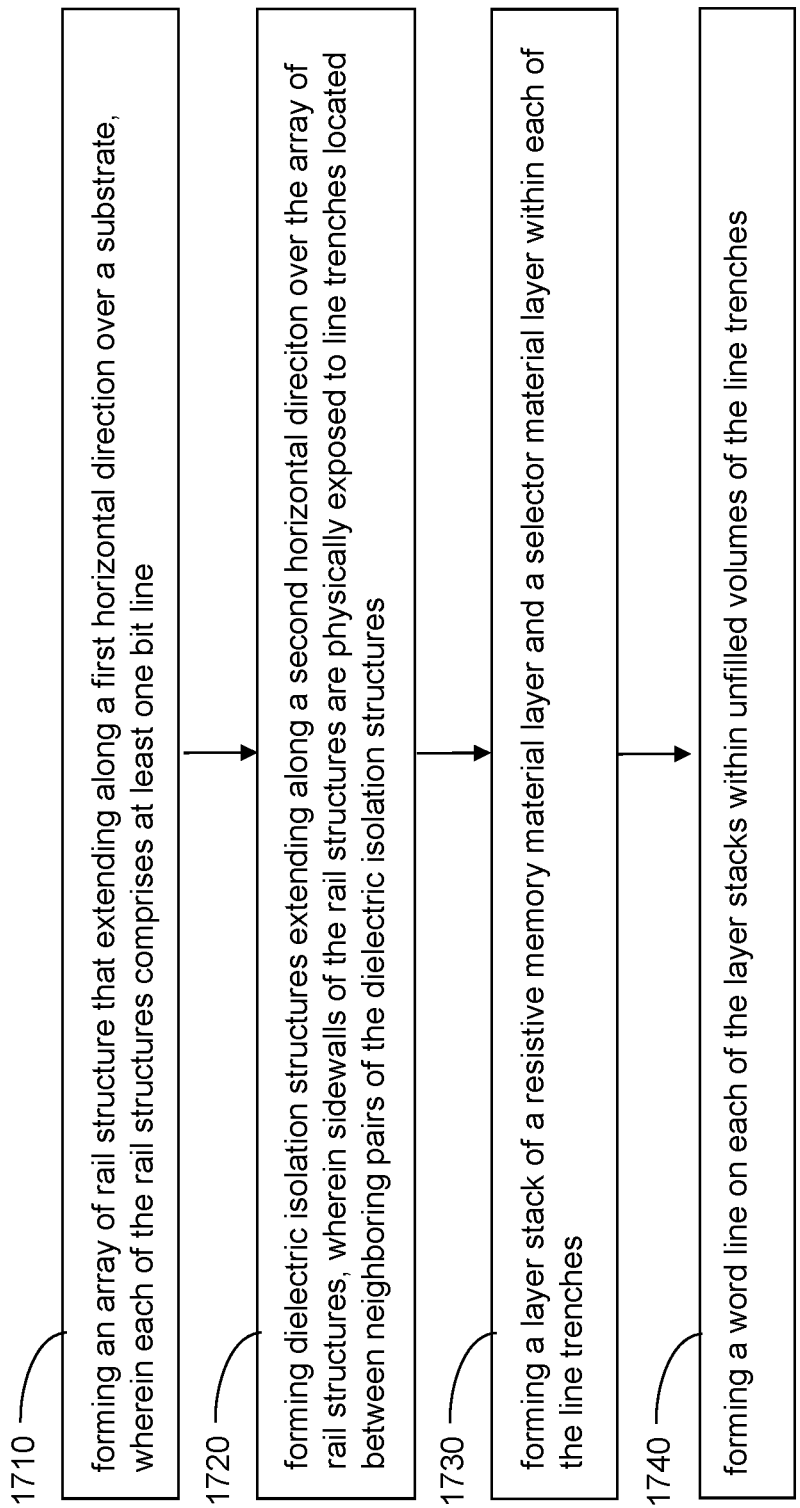
FIG. 17 is a flowchart that illustrates the general processing steps of the methods of the present disclosure.

Referring to FIG. 17, a flowchart illustrates a general method of forming at least one resistive memory array (101, 201) over a substrate 8 according to an embodiment of the present disclosure. Each of the at least one resistive memory array (101, 201) can be formed by performing a set of processing steps illustrated in the flow chart. Referring to step 1710, an array of rail structures (62, 64, 66, 67) that extend along a first horizontal direction hd1 can be formed over a substrate 8. Each of the rail structures (62, 64, 66, 67) comprises at least one bit line (62, 66). Referring to step 1720, dielectric isolation structures 133 extending along a second horizontal direction hd2 can be formed over the array of rail structures (62, 64, 66, 67). Sidewalls of the rail structures (62, 64, 66, 67) are physically exposed to line trenches 71 located between neighboring pairs of the dielectric isolation structures 133. Referring to step 1730, a layer stack (72, 74) of a resistive memory material layer 72 and a selector material layer 74 can be formed within each of the line trenches 71. Referring to step 1740, a word line (76 and optionally 86) can be formed on each of the layer stacks (72, 74) within unfilled volumes of the line trenches 71. The word lines (76 and optionally 86) or at least a subset of the bit lines (62, 66) comprise a carbon-based conductive material containing hybridized carbon atoms in a hexagonal arrangement.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A resistive memory device, comprising:
   an array of rail structures that extend along a first horizontal direction, wherein each of the rail structures comprises at least one bit line;
   word lines that laterally extend along a second horizontal direction and are laterally spaced apart along the first horizontal direction, wherein each of the word lines includes a respective horizontally-extending portion that overlie the rail structures and a respective row of downward-protruding portions that protrude downward from the respective horizontally-extending portion,
   wherein a layer stack of a resistive memory material layer and a selector material layer is located between each of the word lines and respective underlying portions of the array of rail structures;
   wherein the word lines or at least a subset of the bit lines comprise a carbon-based conductive material containing hybridized carbon atoms in a hexagonal arrangement;
   wherein each rail structure within the array of rail structures comprises a vertical stack including a respective lower bit line, a respective inter-bit-line dielectric rail, and a respective upper bit line;
   wherein one of the respective lower bit line and the respective upper bit line comprises the carbon-based conductive material; and
   wherein another of the respective lower bit line and the respective upper bit line comprises a conductive material other than the carbon-based conductive material.

2. The resistive memory device of claim 1, wherein the carbon-based conductive material is selected from carbon nanotubes and graphene in sheets or nanoribbons.

3. The resistive memory device of claim 1, wherein each layer stack continuously extends over each rail structure within the array of rail structures and contacts sidewalls of each bit line within the array of rail structures.

4. The resistive memory device of claim 1, wherein:
each resistive memory material layer comprises a material selected from a phase change memory material and a vacancy-modulated conductive oxide material; and
each selector material layer comprises a material selected from an ovonic threshold switch material and a p-n junction diode material.

5. The resistive memory device of claim 1, further comprising:
first bit line contact structures comprising at least one metallic material and contacting a respective one of the lower bit lines; and
second bit line contact structures comprising the at least one metallic material and contacting a respective one of the upper bit lines.

6. The resistive memory device of claim 1, wherein:
the horizontally-extending portion of each word line comprises the carbon-based conductive material; and
the downward-protruding portions of each word line comprise at least one metallic material.

7. The resistive memory device of claim 1, further comprising dielectric isolation structures located between each neighboring pair of the word lines, including a respective horizontally-extending portion that overlie the rail structures and a respective row of downward-protruding portions that protrude downward between neighboring pairs of the rail structures.

8. A memory device comprising at least one resistive memory array located over a substrate, wherein each of the at least one resistive memory array comprises:
vertical stacks of a respective lower bit line, a respective inter-bit-line dielectric rail, and a respective upper bit line;
word lines that laterally extend along a horizontal direction that is perpendicular to a lengthwise direction of the vertical stacks, wherein each of the word lines includes a respective horizontally-extending portion that overlie each of the vertical stacks and a respective row of downward-protruding portions that protrude downward from the respective horizontally-extending portion between neighboring pairs of the vertical stacks,
wherein a layer stack of a resistive memory material layer and a selector material layer is located between each of the word lines and each sidewall of the vertical stacks;
wherein at least one set selected from a set of the word lines, a set of the lower bit lines, and a set of the upper bit lines comprises a carbon-based conductive material containing hybridized carbon atoms in a hexagonal arrangement;
wherein the lower bit lines comprise a first material selected from the carbon-based conductive material and a conductive material other than the carbon-based conductive material; and
wherein the upper bit lines comprise a second material that is different from the first material and selected from the carbon-based conductive material and the conductive material other than the carbon-based conductive material.

9. The memory device of claim 8, wherein the carbon-based conductive material is selected from carbon nanotubes and graphene in sheets or nanoribbons.

10. The memory device of claim 8, further comprising dielectric isolation structures located between each neighboring pair of the word lines, including a respective horizontally-extending portion that overlie the rail structures and a respective row of downward-protruding portions that protrude downward between neighboring pairs of the vertical stacks, wherein the word lines and the dielectric isolation structures form a laterally alternating sequence that alternate along the first horizontal direction, and have top surfaces that are located within a horizontal plane.

11. The memory device of claim 8, wherein each segment of the resistive memory material layers located between a neighboring pair of a word line selected from the word lines and a bit line selected from the lower bit lines and the upper bit lines constitutes a resistive memory element.

12. The memory device of claim 8, wherein the at least one resistive memory array comprises a plurality of resistive memory arrays located at different levels and overlie, or underlie, each other or one another.

13. The resistive memory device of claim 1, wherein each rail structure within the array of rail structures comprises a respective dielectric cap strip contacting a top surface of the respective upper bit line.

14. The resistive memory device of claim 1, wherein each of the word lines include a respective carbon-based conductive material rail that comprises the carbon-based conductive material containing the hybridized carbon atoms in the hexagonal arrangement.

15. The resistive memory device of claim 14, wherein each of the word lines include a respective metallic nitride liner comprising first horizontally-extending portions contacting first segments of a bottom surface of the respective carbon-based conductive material rail, vertically-extending portions contacting sidewalls of the layer stack, and second horizontally-extending portions contacting top surfaces of horizontally-extending portions of the layer stack.

16. The resistive memory device of claim 15, wherein each of the word lines comprises metallic fill material portions contacting second segments of the bottom surface of the respective carbon-based conductive material rail, sidewalls of the respective metallic nitride liner, and top surfaces of horizontally-extending portions of the respective metallic nitride liner that underlie the metallic fill material portions.

17. The resistive memory device of claim 1, wherein each rail structure within the array of rail structures comprises a pair of straight sidewalls that laterally extends along the first horizontal direction and vertically extends from a topmost surface of a respective rail structure to a bottommost surface of the respective rail structure.

18. A resistive memory device, comprising:
an array of rail structures that extend along a first horizontal direction, wherein each of the rail structures comprises at least one bit line;
word lines that laterally extend along a second horizontal direction and are laterally spaced apart along the first horizontal direction, wherein each of the word lines includes a respective horizontally-extending portion that overlie the rail structures and a respective row of downward-protruding portions that protrude downward from the respective horizontally-extending portion, and wherein each of the word lines includes a metallic nitride material or at least one metallic fill material that continuously extends as a single contiguous metallic material portion into each downward-protruding portion among the respective row of downward-protruding portions and over each of the array of rail structures, wherein a layer stack of a resistive memory material layer and a selector material layer is located between each of the word lines and respective underlying portions of the array of rail structures;

wherein the word lines or the bit lines comprise a carbon-based conductive material containing hybridized carbon atoms in a hexagonal arrangement;

wherein each rail structure within the array of rail structures comprises a vertical stack including a respective lower bit line, a respective inter-bit-line dielectric rail, and a respective upper bit line;

wherein one of the respective lower bit line and the respective upper bit line comprises the carbon-based conductive material; and wherein another of the respective lower bit line and the respective upper bit line comprises a conductive material other than the carbon-based conductive material.

19. The resistive memory device of claim 18, wherein:

the single contiguous metallic material portion has horizontal top surfaces over the array of rail structures; and each of the bit lines comprises a respective carbon-based conductive material rail including the carbon-based conductive material and having a horizontal bottom surface in contact with a horizontal top surfaces of the single contiguous metallic material portion.

20. The resistive memory device of claim 18, each rail structure within the array of rail structures comprises a pair of straight sidewalls that laterally extends along the first horizontal direction and vertically extends from a topmost surface of a respective rail structure to a bottommost surface of the respective rail structure.

* * * * *